US007259426B2

(12) United States Patent
Aida et al.

(10) Patent No.: US 7,259,426 B2
(45) Date of Patent: Aug. 21, 2007

(54) SEMICONDUCTOR DEVICE AND ITS MANUFACTURING METHOD

(75) Inventors: Satoshi Aida, Hyogo-ken (JP); Shigeo Kouzuki, Hyogo-ken (JP); Satoshi Yanagisawa, Kanagawa-ken (JP); Masaru Izumisawa, Kanagawa-ken (JP); Hironori Yoshioka, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 11/094,190

(22) Filed: Mar. 31, 2005

(65) Prior Publication Data

US 2005/0250322 A1 Nov. 10, 2005

(30) Foreign Application Priority Data

May 6, 2004 (JP) ............................ 2004-137835

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/341; 257/288; 257/544; 257/213; 257/E21.048; 257/E21.19; 257/E29.257

(58) Field of Classification Search ................ 257/341, 257/27, 68, 192, 197, 213, 274, 288, 350, 257/296, 401, 544

See application file for complete search history.

(56) References Cited

U.S. PATENT DOCUMENTS

| | | | | |
|---|---|---|---|---|
| 5,438,215 | A * | 8/1995 | Tihanyi | 257/401 |
| 5,973,360 | A * | 10/1999 | Tihanyi | 257/330 |
| 6,040,600 | A * | 3/2000 | Uenishi et al. | 257/330 |
| 6,081,009 | A * | 6/2000 | Neilson | 257/341 |
| 6,184,555 | B1 * | 2/2001 | Tihanyi et al. | 257/342 |
| 6,362,505 | B1 * | 3/2002 | Tihanyi | 257/329 |
| 6,410,958 | B1 * | 6/2002 | Usui et al. | 257/329 |
| 6,521,954 | B1 * | 2/2003 | Kouzuki et al. | 257/374 |
| 6,740,931 | B2 | 5/2004 | Kouzuki et al. | 257/341 |
| 6,849,900 | B2 * | 2/2005 | Aida et al. | 257/341 |

FOREIGN PATENT DOCUMENTS

JP 2001-298191 10/2001

* cited by examiner

*Primary Examiner*—David Nhu
(74) *Attorney, Agent, or Firm*—Oblon, Spivak, McClelland, Maier & Neustadt, P.C.

(57) ABSTRACT

There is provided a power MISFET which includes a semiconductor region of a first conductivity, a semiconductor base region of a second conductivity, a pillar region, a first major electrode region of a first conductivity on the base region, a second major electrode region connected with at least the semiconductor region and a part of the pillar region, a control electrode and an electrode pad connected with the control electrode. The pillar region including a first region of a first conductivity type and a second region of a second conductivity type is not formed under the electrode pad. Also, a method for manufacturing a MISFET is provided.

16 Claims, 31 Drawing Sheets

SEMICONDUCTOR DEVICE AND ITS MANUFACTURING METHOD

CROSS-REFERENCE TO RELATED APPLICATIONS

This application is based upon and claimed the benefits of priority from the prior Japanese Patent Application No. 2004-137835, filed on May 6, 2004, the entire contents of which are incorporated herein by reference.

BACKGROUND OF THE INVENTION

This invention relates to a semiconductor device and its manufacturing method, especially to a semiconductor device having a MIS (Metal-Insulator-Semiconductor) FET and its manufacturing method.

A power MISFET is one of many kinds of MIS gate semiconductors. And the power MISFET is in brisk demand for a main switching device in a switching circuit.

FIG. 35 is a cross-sectional view of the power MISFET active region as described in Japanese Patent Laid-Open No. 2001-298191. Also, FIG. 36 is a cross-sectional view of an enlarged electrode portion in scale.

In this MISFET there is provided an n-type pillar region 16 and a p-type pillar region 18 on an $n^+$-type silicon substrate 12 in parallel and this parallel pairs are disposed in a successive form on the $n^+$-type silicon substrate. A $p^+$-type base region is provided on the p-type pillar region (on the opposite side of the $n^+$-type silicon substrate), and also an $n^+$-type source region 22 is provided thereon. A gate insulator film 24 is formed on the surface portion which includes the n-type pillar region, the $n^+$-type source region and the p-type base region therebetween. A gate electrode 26 (control electrode) is formed on the gate insulator film 24. A side surface and an upper surface of the gate electrode 26 are protected for insulation by an inter-layer insulator 27. A portion of the p-type base region and a portion of the n-type source region are connected with a source electrode 28 (major electrode). On the other hand, a bottom surface of the n-type substrate is connected with a drain electrode 30 (other major electrode).

When an ON-voltage is supplied to the gate electrode 26, an inversion layer occurs on the surface of the p-type base region 20 facing the gate electrode via the gate insulator film 24, and hence a channel layer is formed. As a result, since the n-type source region and the n-type pillar region are connected, the main current can flow between the source electrode 28 and the drain electrode 30.

However, the Inventers found during a development that the above-mentioned device has a disadvantage as follows. If an avalanche break down occurs under a bonding pad for a gate electrode connection, an avalanche current concentrates in a part of the source region 22 adjacent to the bonding pad and hence an avalanche breakdown voltage is reduced.

SUMMARY OF THE INVENTION

According to an aspect of the invention, there is provided a semiconductor device comprising:

a first semiconductor layer including:

a semiconductor region of a first conductivity type;

a semiconductor base region of a second conductivity type;

a semiconductor pillar region having a first semiconductor pillar region of a first conductivity type and a second semiconductor pillar region of a second conductivity type, the first semiconductor pillar region and the second semiconductor pillar region being formed alternately according to a predetermined successive pattern, and each of the first and second semiconductor pillar regions being electrically connected with the semiconductor base region;

a first major electrode region of a first conductivity type selectively provided on the semiconductor base region; and a second major electrode region connected with at least the semiconductor region and the first semiconductor pillar region;

a control electrode configured to control a current between the first major electrode region and the second major electrode region; and an electrode pad provided on a pad formation part of the first semiconductor layer via an insulator and connected with the control electrode, the pad formation part including a successive pattern nonformation part where the predetermined successive pattern of the pillar region is not formed.

According to another aspect of the invention, there is provided a semiconductor device comprising:

a first semiconductor layer including:

a semiconductor region of a first conductivity type;

a semiconductor base region of a second conductivity type;

a semiconductor pillar region having a first semiconductor pillar region of a first conductivity type and a second semiconductor pillar region of a second conductivity type, the first semiconductor pillar region and the second semiconductor pillar region being formed alternately according to a predetermined successive pattern, and each of the first and second semiconductor pillar regions being electrically connected with the semiconductor base region;

a first major electrode region of a first conductivity type selectively provided on the semiconductor base region; and a second major electrode region connected with at least the semiconductor region and the first semiconductor pillar region;

a control electrode configured to control a current between the first major electrode region and the second major electrode region;

a wiring layer provided on a wiring formation part of the first semiconductor layer via an insulator and connected with the control electrode; and an electrode pad connected with the wiring layer, the wiring formation part including a successive pattern nonformation part where the predetermined successive pattern of the pillar region is not formed.

According to another aspect of the invention, there is provided a method for manufacturing a semiconductor device comprising:

forming a semiconductor layer of a first conductivity type on a major surface of a semiconductor substrate of a first conductivity type;

forming a trench in the semiconductor layer;

forming a first pillar region of a first conductivity type and a second pillar region of a second conductivity type by diffusing the first and second conductivity type impurities through a side wall of the trench;

forming a semiconductor base region of a second conductivity type by introducing an impurity of a second conductivity type on the surface of the semiconductor, the semiconductor base region being connected with the first and second semiconductor pillar regions;

forming a first major electrode region of a first conductivity type selectively on the semiconductor base region;

forming an insulating layer on the semiconductor base region between the first major electrode region and the first pillar region;

forming a control electrode on the insulating layer in a position facing to the semiconductor base region;

forming a second major electrode connected with the semiconductor substrate; and forming an electrode pad via the insulating film on the semiconductor layer in which the trench is not formed, the electrode pad being connected with the control electrode.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

FIRST EMBODIMENT

Figure 1:
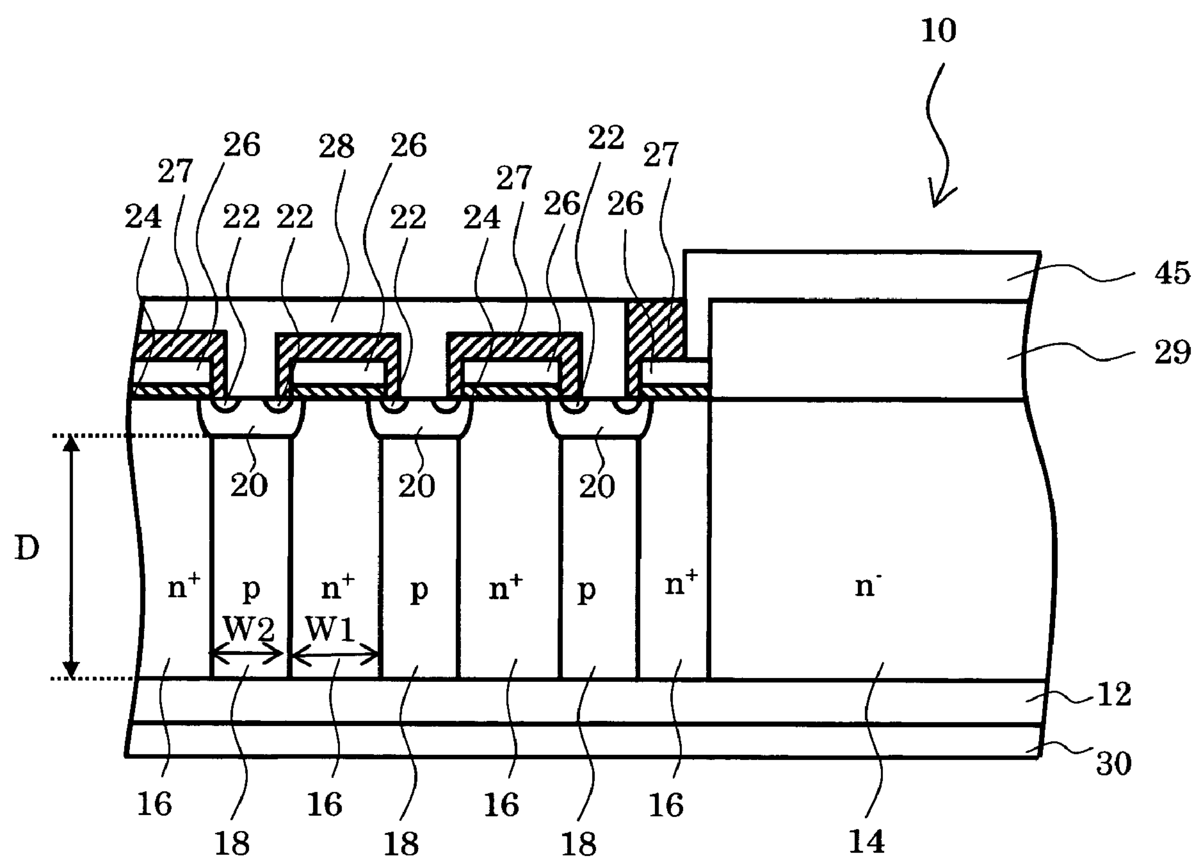
FIG. 1 is an enlarged cross-sectional view of the semiconductor device according to a first embodiment.

FIG. 1 is an enlarged cross-sectional view of the semiconductor device according to a first embodiment of the invention in scale.

Figure 2:
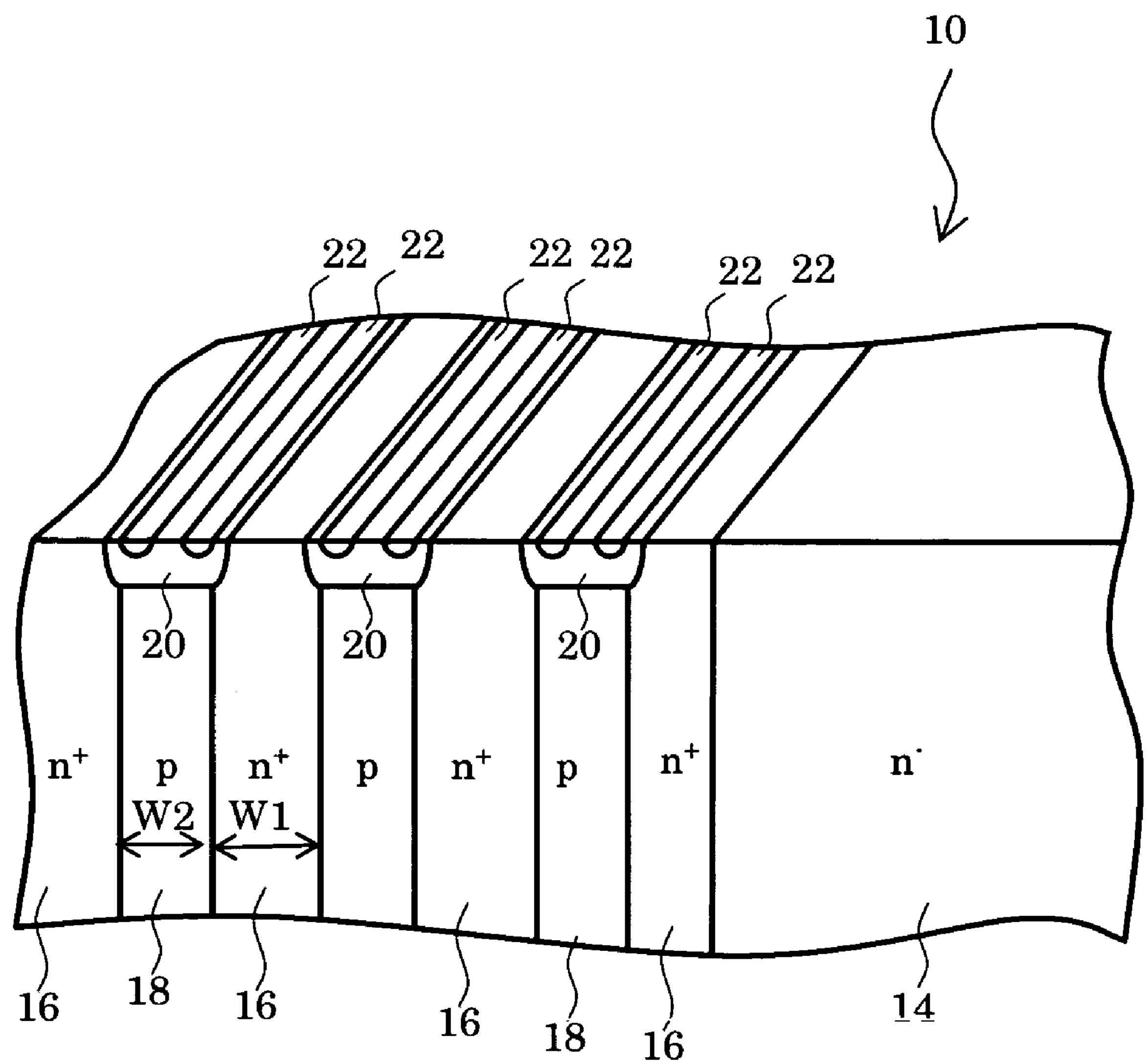
FIG. 2 is a partially cutaway view in perspective of the semiconductor device of FIG. 1.

FIG. 2 is a partially cutaway view in perspective of the device of FIG. 1.

Figure 3:
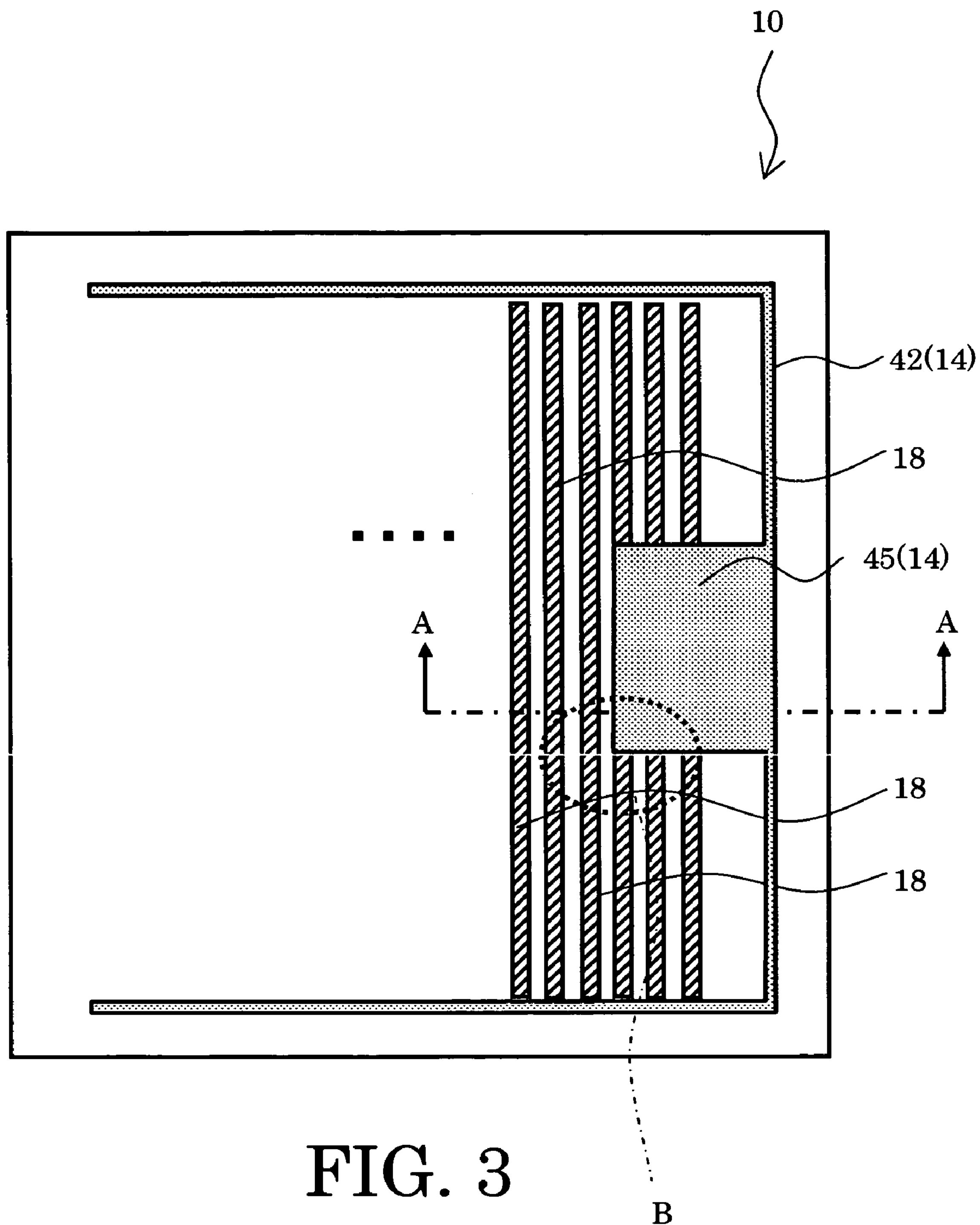
FIG. 3 is a plan view of the semiconductor device of FIG. 1.

FIG. 3 is a plan view of the entire semiconductor device and FIGS. 1 through 2 are the views taken along the line A-A.

Figure 4:
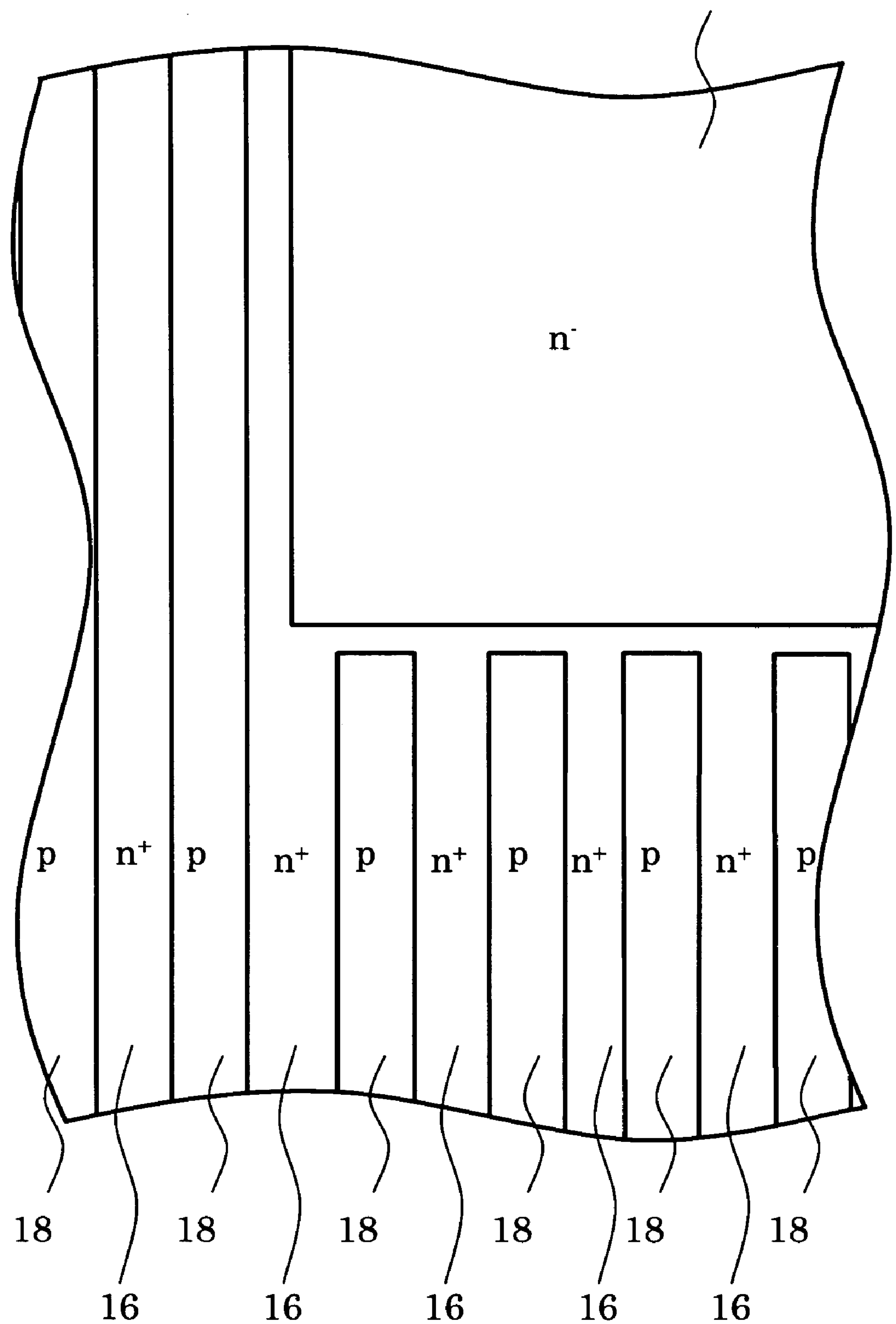
FIG. 4 is an enlarged plan view in a "B" area shown in FIG. 3.

FIG. 4 is an enlarged plan view showing a layout of the constitutional parts of the device in the region "B" shown in FIG. 3.

A semiconductor device 10 according to the first embodiment has a structure including an n-type pillar region 16 and a p-type pillar region 18 in parallel on an $n^+$-silicon substrate 12. Each pillar is extending toward a predetermined direction, as shown in FIG. 2. In FIG. 3, a few parallel pillars are shown. In this case, a depth D of each pillar (16 and 18) may be approximately 60 μm, for example. Also, a width W1 of the n-type pillar region 16 and a width W2 of the p-type pillar region 18 are approximately 10 μm, respectively.

A $p^+$-type base region 20 is provided in a planer form on the p-type pillar region 18, and an $n^+$-type source region 22 is also provided in a planer form thereon. A gate insulator film 24 is formed on the surface portion which includes the n-type pillar region, the $n^+$-type source region and the p-type base region therebetween. A gate electrode 26 (control electrode) is formed on the gate insulator film 24. A side surface and a upper surface of the gate electrode 26 are protected for insulation by an inter-layer insulator 27. A portion of the p-type base region and a portion of the n-type source region are connected with a source electrode 28 (major electrode). On the other hand, a bottom surface of the n-type substrate is connected with a drain electrode 30 (other major electrode).

When an ON-voltage is supplied to the gate electrode 26, an inversion layer occurs on the surface of the p-type base region 20 facing the gate electrode via the gate insulator 24, and hence a channel layer is formed. As a result, since the n-type source region and the n-type pillar region are connected, the main current can flow between the source electrode 28 and the drain electrode 30.

As shown in FIG. 3, a gate interconnection 42 is provided on an outer surface of the semiconductor device so as to surround an inner active region. This gate interconnection 42 is connected with the gate electrode 26 via contact holes (not shown) in an inter-layer insulator 27. And this gate interconnection is connected with the gate bonding pad 45. The bonding pad is connected with an external circuit by bonding wire or a conductive plate. The bonding pad and gate interconnection are formed on an insulator film 29. And the n-type pillar region and the p-type pillar region are not formed under the gate bonding pad and the gate interconnection in this embodiment, but an n-type region 14 is provided instead. By introducing such structure, an avalanche breakdown voltage is improved drastically without a degradation of a switching speed of the semiconductor device. This reason will be explained hereinafter.

A MISFET characteristic depends on the carrier concentration of the pillar regions 16 and 18. If the carrier concentration of the n-type pillar region is higher than that of the p-type pillar region, the ON resistance can be reduced. This is because the main current flows between the major electrodes 28 and 30 through the n-type pillar region 16, and the resistance of this region can be reduced. Inversely, if the carrier concentration of the n-type pillar region is lower than that of the pillar region, a switching speed becomes higher. This is because the n-type pillar region through which the main current flows can be depleted quickly when a p-n junction between the pillar regions 16 and 18 is reverse-biased.

Figure 5:
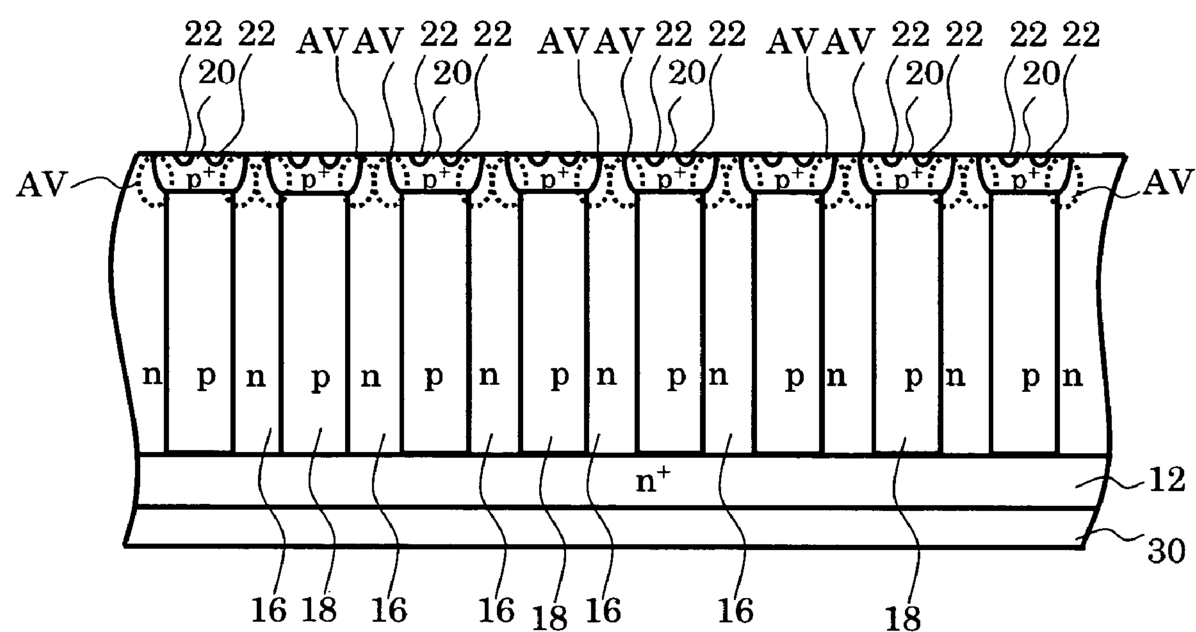
FIG. 5 is a graphic representation showing an avalanche break-down region in a vicinity of a p-n junction between the pillar region and the p-type base region.
Figure 6:
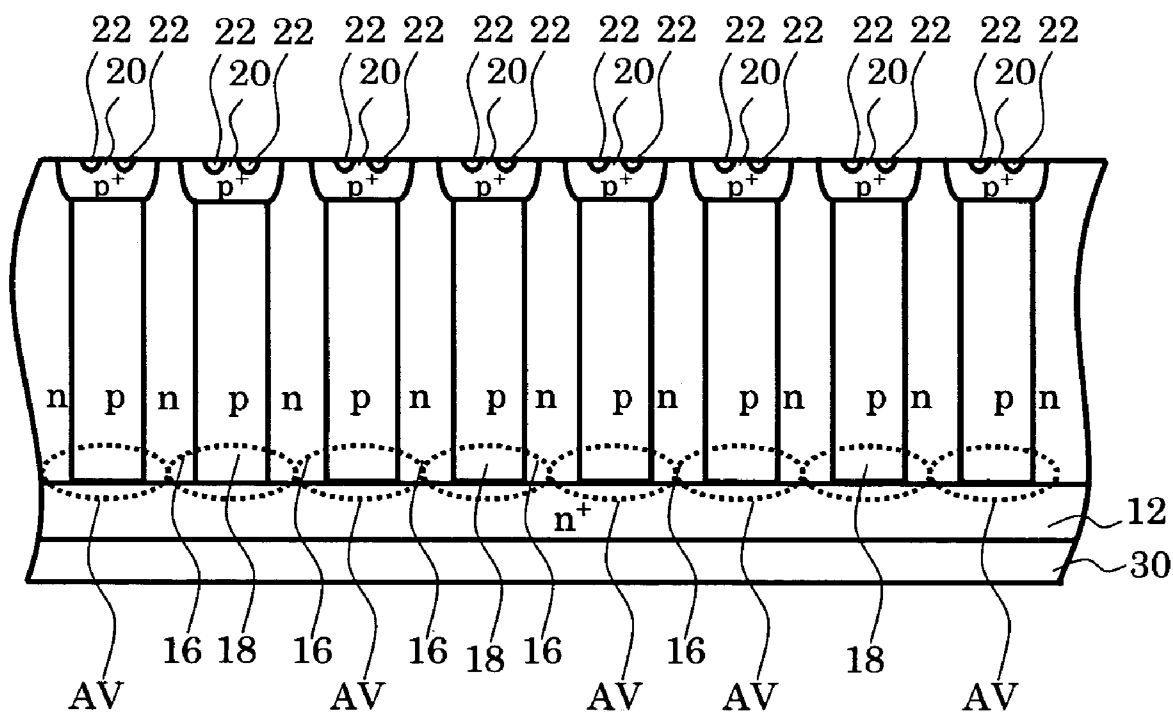
FIG. 6 is a graphic representation showing an avalanche break-down region in a vicinity of a p-n junction between the p-type pillar region and the n+-type silicon substrate.

On the other hand, an avalanche breakdown position which determines a rated reverse voltage is different according to the carrier concentration of the pillar regions 16 and 18. In a case of a higher carrier concentration of the n-type pillar region, an avalanche breakdown occurs in a p-n junction between the n-type pillar region 16 and the p-type base region 20, as shown in FIG. 5 by broken circle "AV". On the other hand, in a case of a higher carrier concentration of the p-type pillar region 18, an avalanche breakdown occurs in a p-n junction between the p-type pillar region 18 and the $n^+$-type substrate 12, as shown by broken circle "AV" in FIG. 6.

Figure 7:
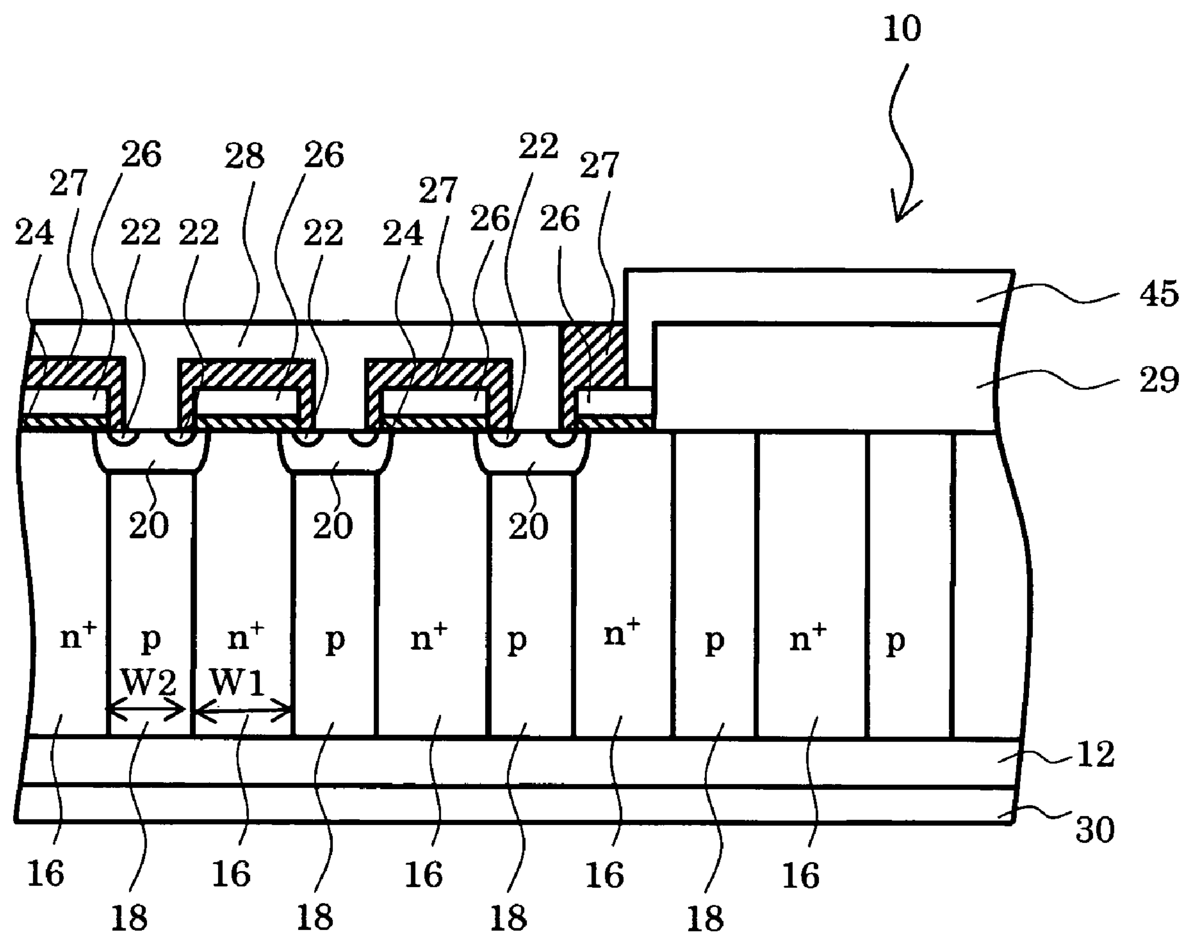
FIG. 7 is an enlarged cross-sectional view of a comparative semiconductor device examined by the Inventors during the invention.
Figure 8:
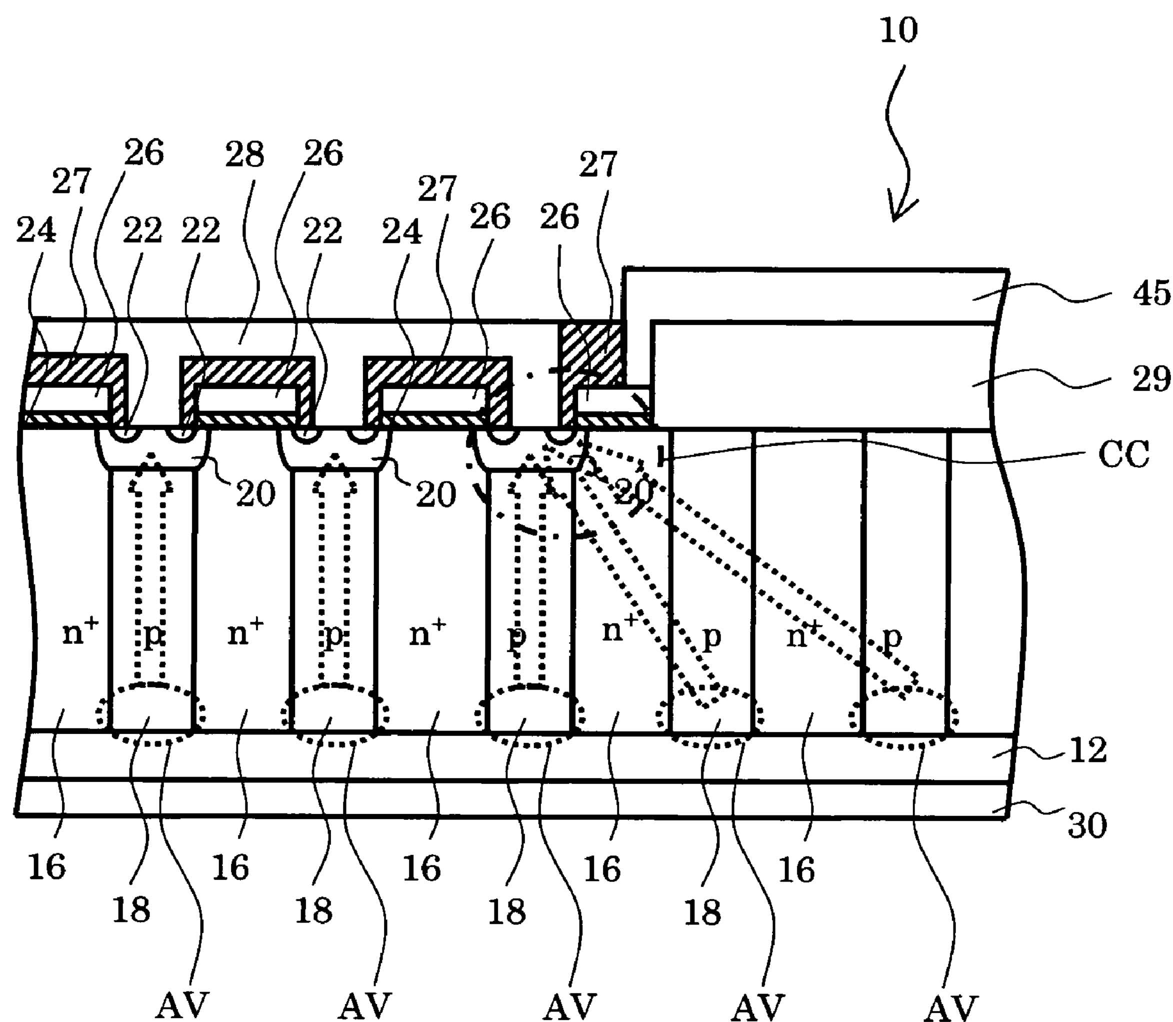
FIG. 8 is a graphic representation showing that the carriers generated in a vicinity of a p-n junction under the gate bonding pad concentrate in the source contact adjacent to the bonding pad.
Figure 9:
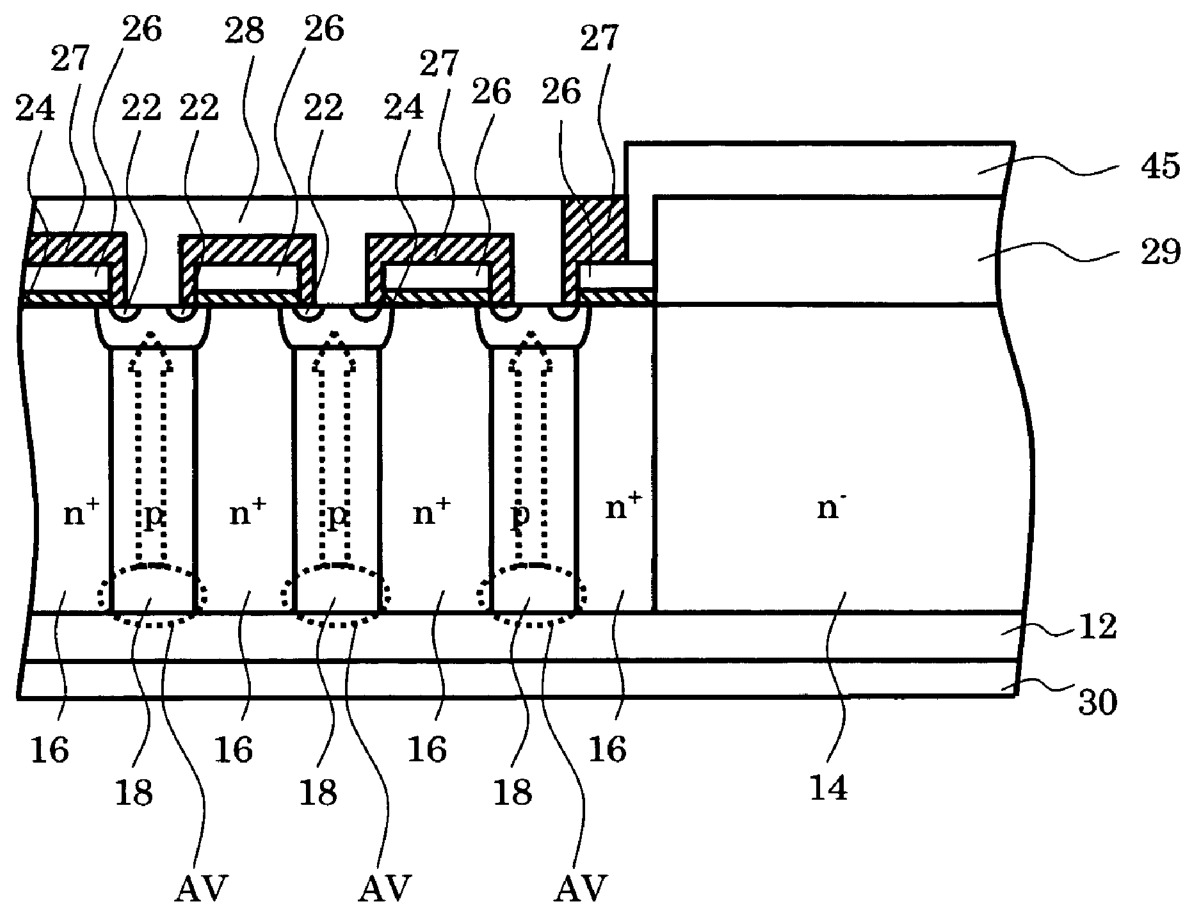
FIG. 9 is a graphic representation of showing that the avalanche break-down and the current concentration are suppressed.

FIG. 7 is a cross-sectional view of a comparative device examined by the Inventors during the invention. In this figure, each element has the same number as that of FIGS. 1 through 6. In this comparative device, the n-type pillar region 16 and the p-type pillar region 18 are provided under the gate bonding pad 45. If the carrier concentration of the n-type pillar region 16 is lower than that of the p-type pillar region 18 in order to obtain a higher switching speed, the avalanche breakdown occurs between the p-type pillar region 18 and the $n^+$-type substrate 12, as described above. Then the carriers which are generated in the p-n junction between the p-type pillar region and the $n^+$-type substrate under the gate bonding pad concentrate in the source contact adjacent to the bonding pad 45, as shown by dashed circle "CC" in FIG. 8. In other words, since the carriers generated by the avalanche breakdown can not be evacuated due to absence of path, these carriers concentrate in the source region 22 adjacent to the gate bonding pad 45 and the gate interconnection 42. Therefore, a problem occurs such that the avalanche breakdown voltage is reduced when the MISFET is operated under an inductive load.

On the contrast, the n-type pillar region and the p-type pillar region are not formed under the gate bonding pad 45 and the gate interconnection 42 in this embodiment, but an n-type region 14 is provided instead. By introducing such structure, an avalanche breakdown does not occur under the gate bonding pad and the gate interconnection, and hence the current concentration in the source contact region can be avoided. As a result, the avalanche breakdown voltage of the MISFET is improved substantially. In other words, even if the concentration of the p-type pillar region is higher for a high speed switching, the avalanche breakdown voltage of the MISFET is not degraded.

The semiconductor device shown in FIGS. 1 through 6 is only an example. A few layouts different from that of FIG. 3 are explained below.

Figure 10:
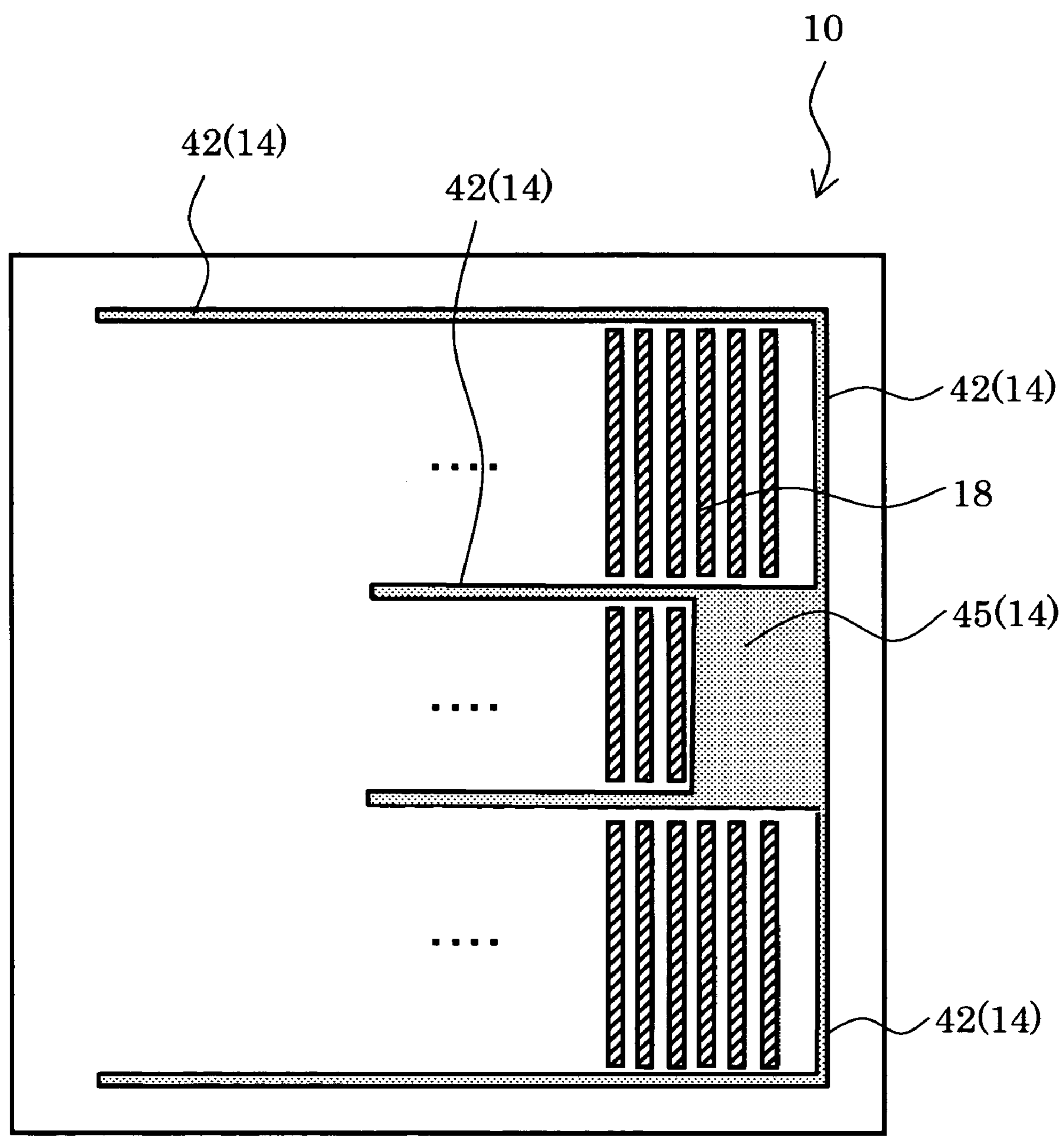
FIG. 10 is a plan view of the modified semiconductor device according to another embodiment.

FIG. 10 is a plan view of the semiconductor device having another layout. In this embodiment, four gate interconnections 42 are provided which are extending toward a direction approximately perpendicular to the direction toward which the pillar regions 16 and 18 are extending. These gate interconnections are connected with the gate electrodes by certain connecting means (not shown). Since these gate interconnections are connected with the gate bonding pad, a gate control voltage can be supplied from an external circuit. the n-type pillar region and the p-type pillar region are not formed under the gate bonding pad 45 and the gate interconnection 42 in this embodiment, but an n-type region 14 is provided instead. By introducing such structure, an avalanche breakdown can be suppressed under the gate bonding pad and the gate interconnection, and hence the avalanche breakdown voltage of the MISFET can be improved substantially.

Figure 11:
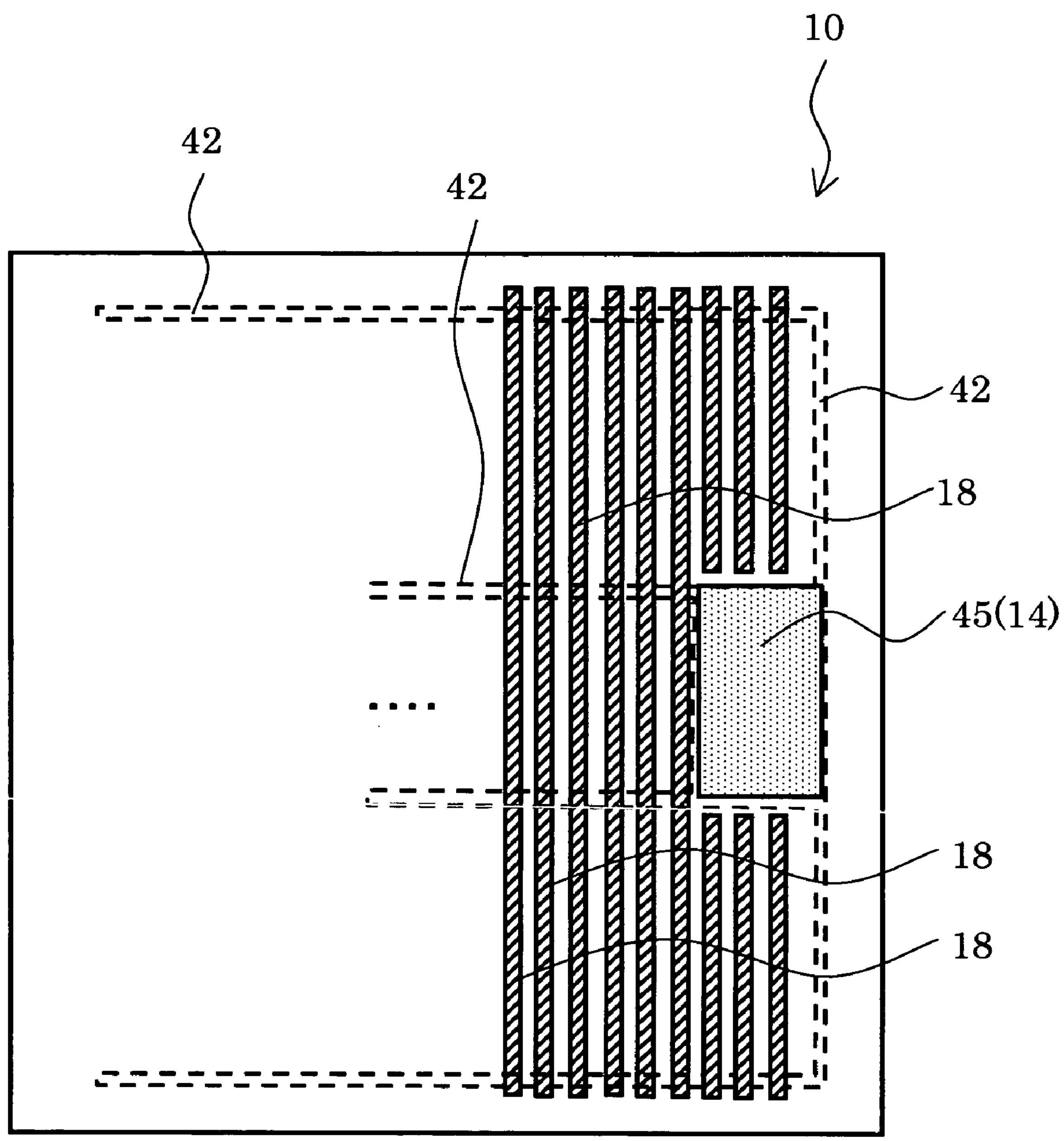
FIG. 11 is a plan view of the semiconductor device of another embodiment.

FIG. 11 is a plan view of the semiconductor device having another layout. In this embodiment, the gate interconnections and the gate bonding pad have the same layout as those of FIG. 10. However, an n-type region is provided only under the gate bonding pad having a relatively large area. On the other hand, the n-type pillar region and the p-type pillar region are formed under the gate interconnection. The area of the gate interconnection is smaller than that of the gate bonding pad. Since the avalanche current caused by providing the pillar regions 16 and 18 is relatively small, the problems are not so serious in some cases. The advantage of this embodiment is that the patterning process becomes easy because it is not necessary to align the n-type region with the relatively complicated gate interconnection shape.

Figure 12:
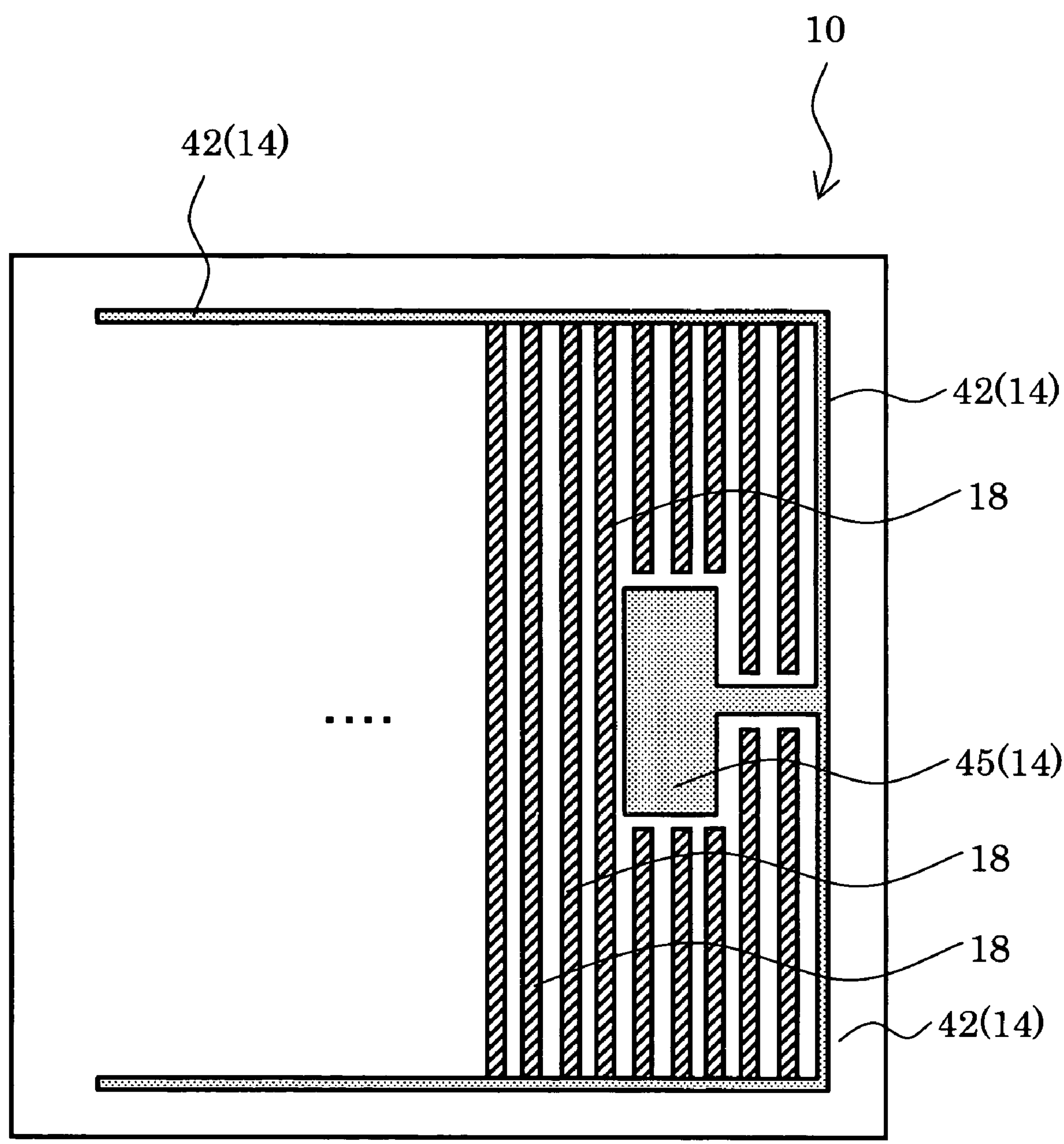
FIG. 12 is a plan view of the semiconductor device of another embodiment.

FIG. 12 is a plan view of the semiconductor device having another layout. In this embodiment, the gate interconnection 42 is provided along three outer edges and the gate bonding pad 45 is provided in relatively central portion apart from the outer edge. In this embodiment, the pillar regions 16 and 18 are not formed under the gate interconnection and the gate bonding pad, but the n-type region is provided instead. As a result, the avalanche breakdown voltage is improved.

Figure 13:
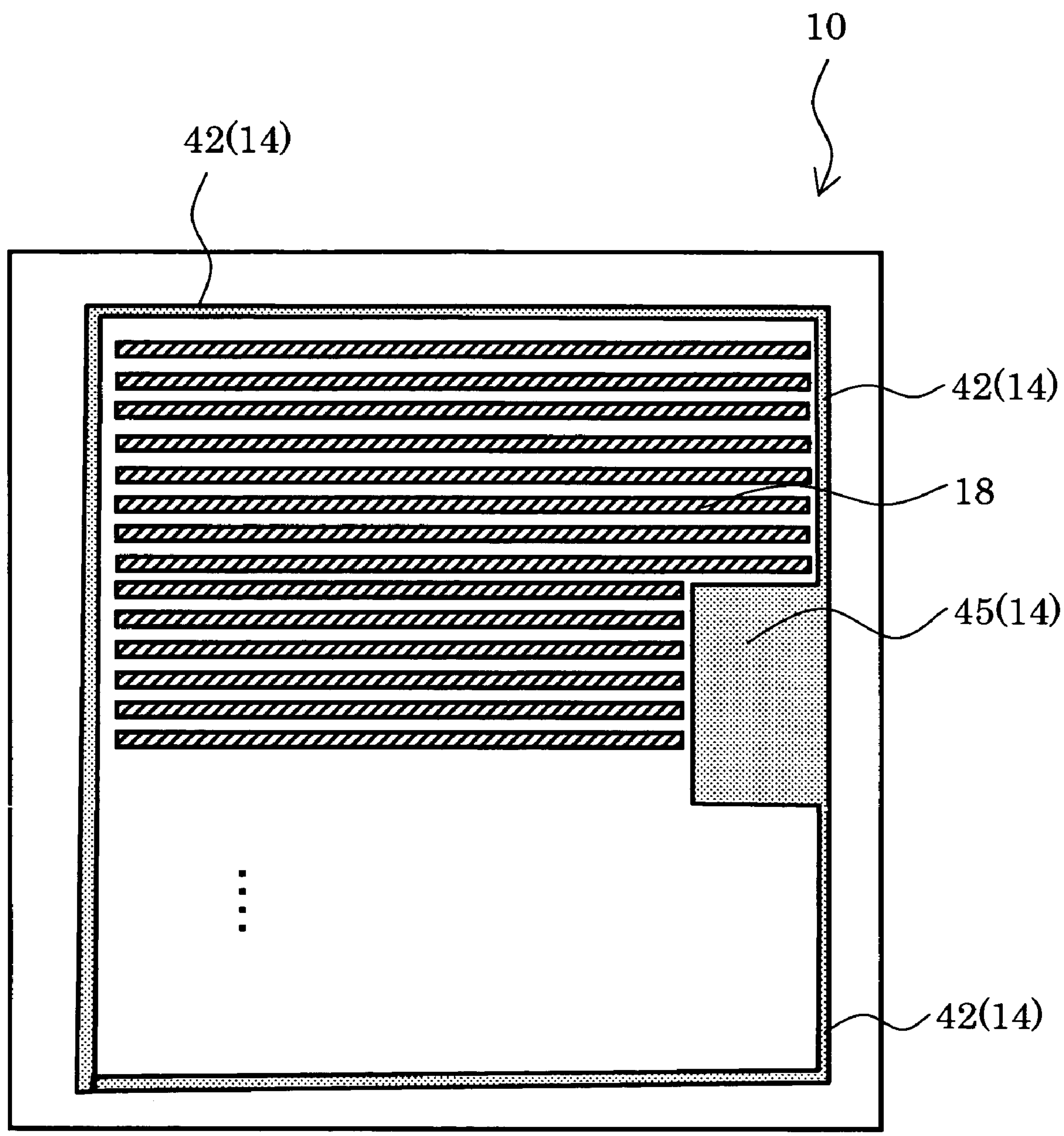
FIG. 13 is a plan view of the semiconductor device of another embodiment.

FIG. 13 is a plan view of the semiconductor device having another layout. In this embodiment, the gate interconnection 42 is provided so as to surround the inner active region parallel to the outer edges and the gate bonding pad 45 is provided in contact with a portion of the interconnection. Since both ends of the extending gate electrode toward a certain direction are connected with the gate interconnection 42, it becomes possible to supply the gate electrode with a uniform voltage along the extending direction. In this embodiment, the pillar regions 16 and 18 are not formed under the gate interconnection and the gate bonding pad, but the n-type region is provided instead. As a result, the avalanche breakdown voltage is improved.

Figure 14:
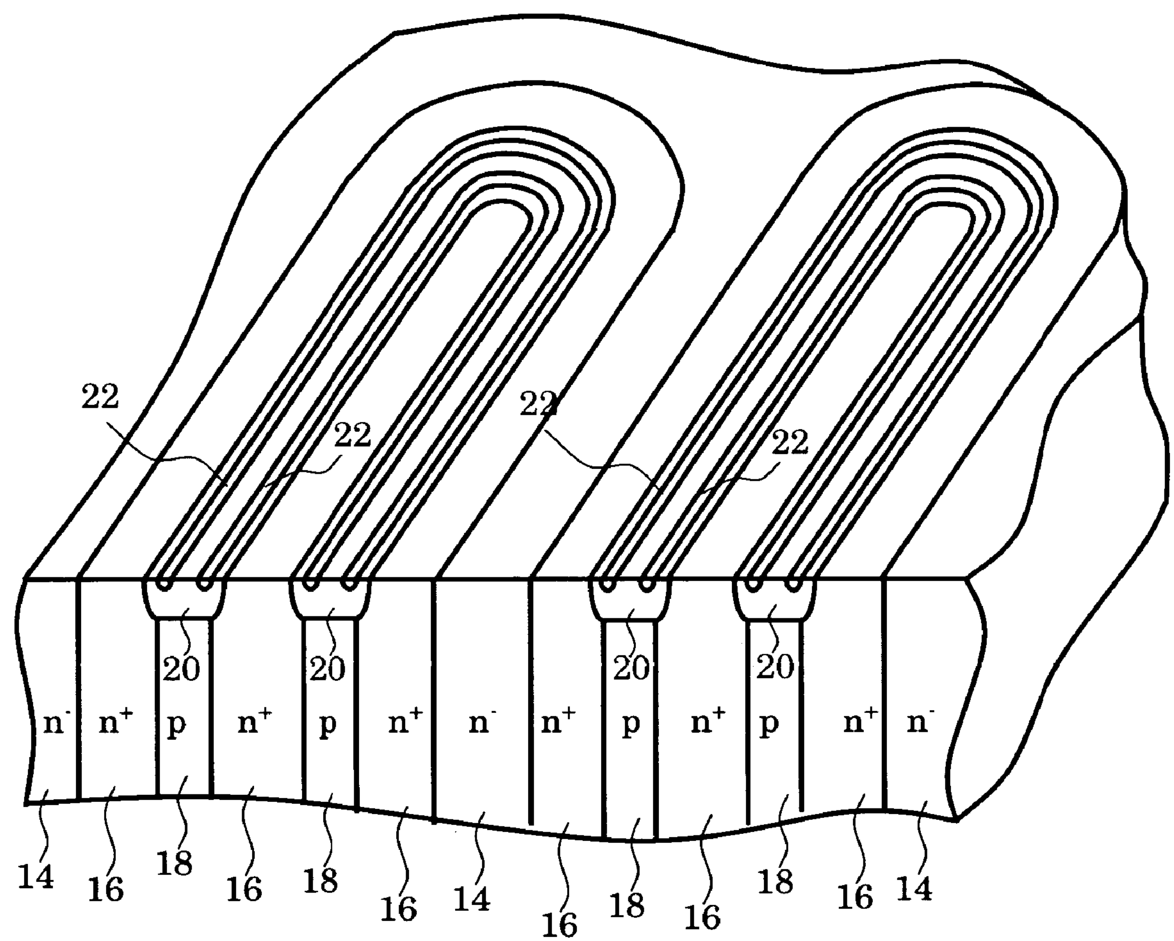
FIG. 14 is a partially cutaway view in perspective of the modified pillar structure.
Figure 15:
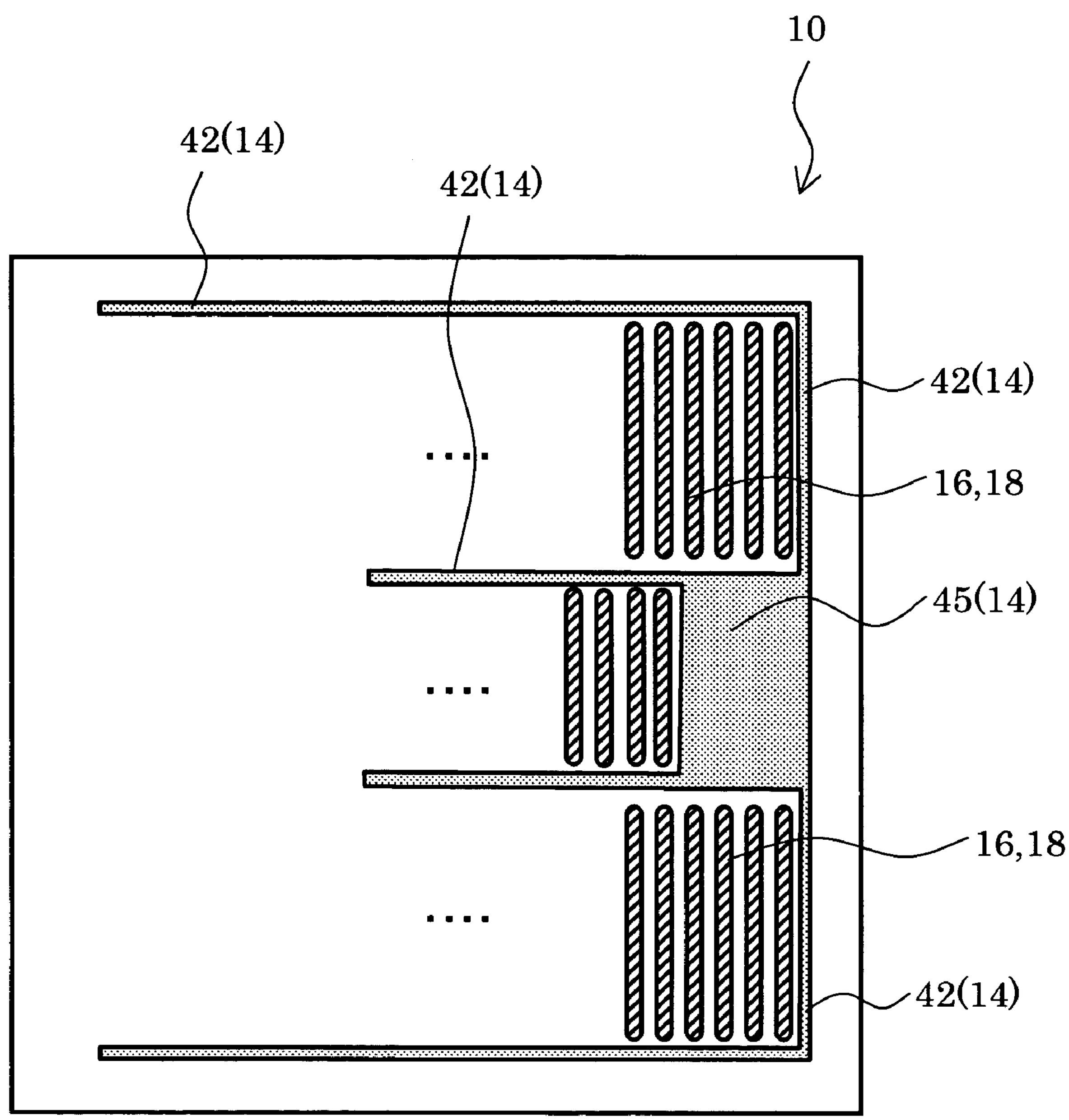
FIG. 15 is a plan view showing the gate interconnection and bonding pad layout of the device of FIG. 14.

FIG. 14 is a partially cutaway view in perspective of the modified pillar structure. In this embodiment, the n-type pillar region 16 and the p-type pillar region have a concentric "racetrack" shape extending toward a certain direction, and are surrounded by the $n^-$-type region 18, FIG. 15 is a plan view showing the gate interconnection and bonding pad layout of the device of FIG. 14. The "racetrack" shape pillar regions 16 and 18 are not formed under the gate interconnection and the gate bonding pad, as shown in FIG. 15. The $n^-$-type region 14 is provided under the gate interconnection and the gate bonding pad. By introducing such structure, also, an avalanche breakdown can be suppressed under the gate bonding pad and the gate interconnection, and hence the avalanche breakdown voltage of the MISFET can be improved substantially.

Figure 16:
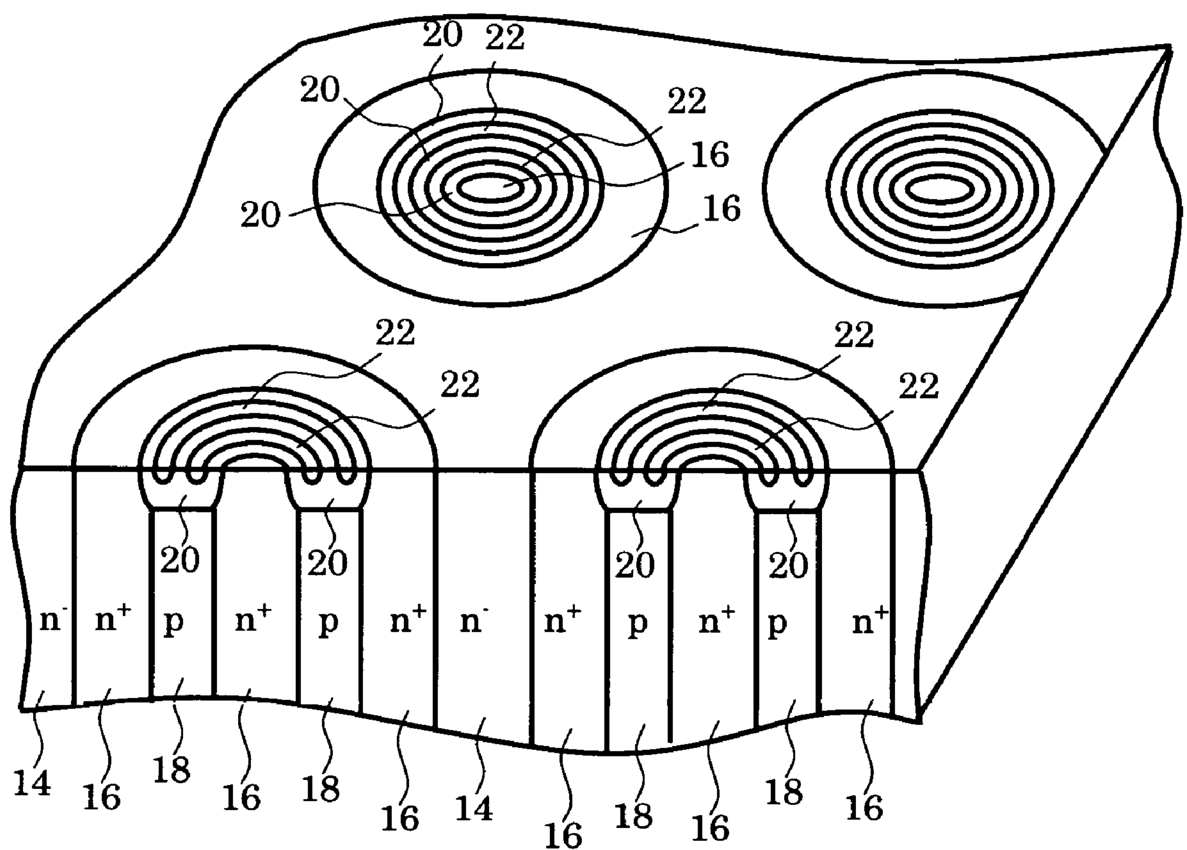
FIG. 16 is a partially cutaway view in perspective of another modified pillar structure.

FIG. 16 is a partially cutaway view in perspective of another modified pillar structure. In this embodiment, the n-type pillar region and the p-type pillar region have a concentric ring shape and are surrounded by the $n^-$-type region.

Figure 17:
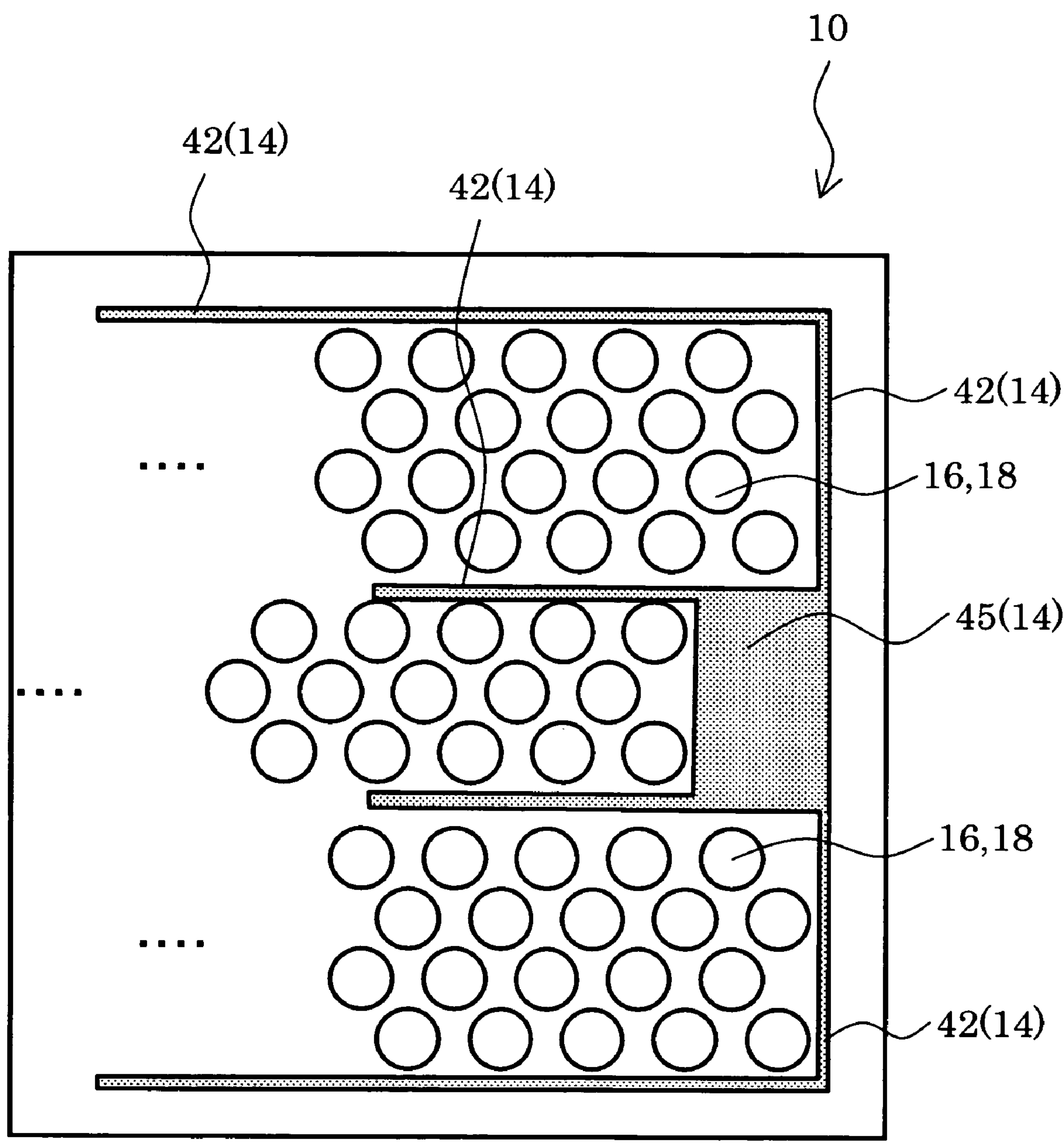
FIG. 17 is a plan view showing the gate interconnection and bonding pad layout of the device of FIG. 16.

FIG. 17 is a plan view of the device of FIG. 16. The concentric ring shape pillar regions 16 and 18 are not formed under the gate interconnection 42 and the gate bonding pad 45. The $n^-$-type region 14 is provided under the gate interconnection and the gate bonding pad. By introducing such structure, also, an avalanche breakdown can be suppressed under the gate bonding pad and the gate interconnection, and hence the avalanche breakdown voltage of the MISFET can be improved substantially.

The method for manufacturing the semiconductor device will be now described hereinafter. FIGS. 18 through 23 are cross-sectional views of the semiconductor device according to the embodiment in each manufacturing step.

Figure 18:
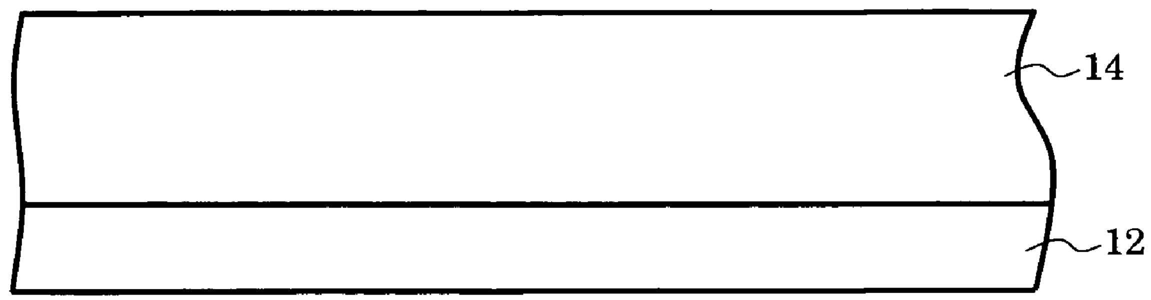
FIG. 18 is an enlarged cross-sectional view of the MISFET according to the first embodiment in a manufacturing step.

FIG. 18 is a cross-sectional view of a wafer. An $n^-$-type layer of about 8 μm-thickness is grown epitaxially on the $n^+$-type silicon substrate 12. After a mask layer (not shown) is formed, an n-type impurity and a p-type impurity are implanted selectively.

Figure 19:
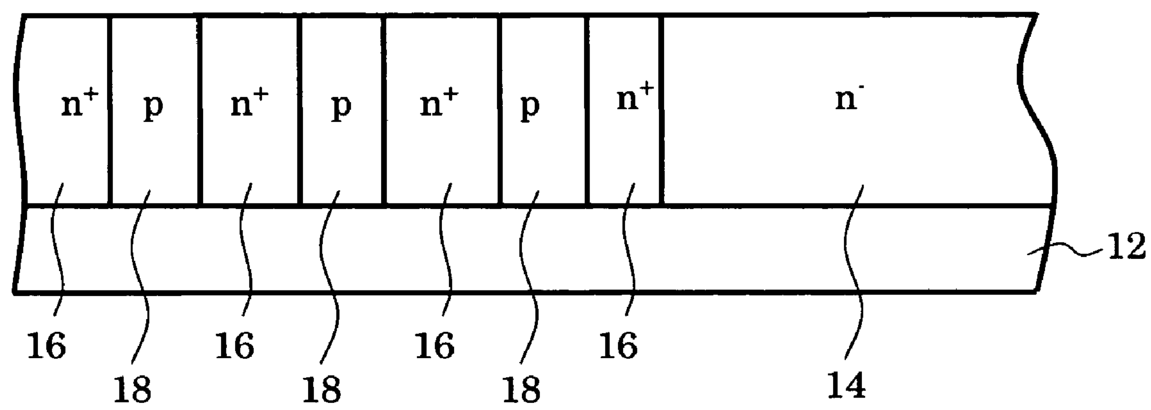
FIG. 19 is an enlarged cross-sectional view of the first embodiment of the MISFET according to the invention in a manufacturing step.
Figure 20:
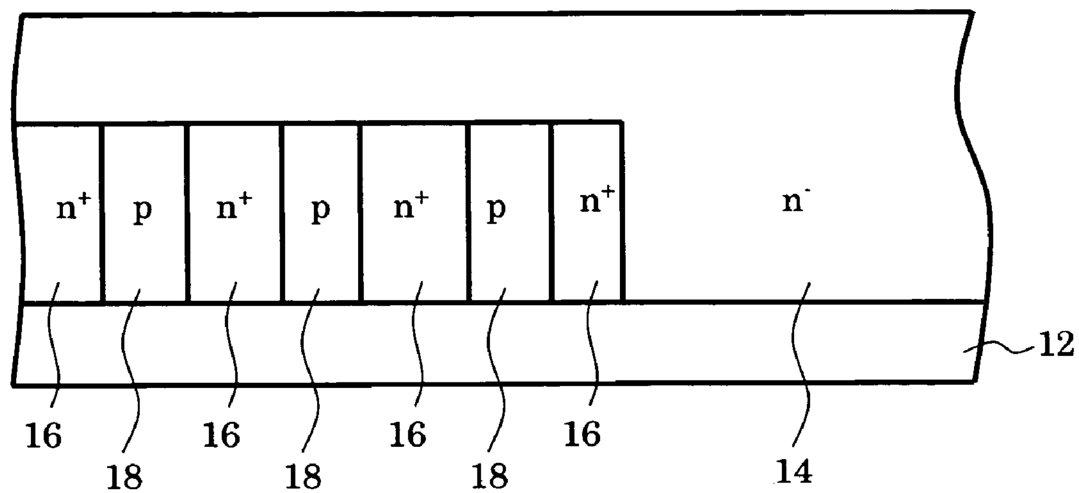
FIG. 20 is an enlarged cross-sectional view of the MISFET according to the first embodiment in a manufacturing step.
Figure 21:
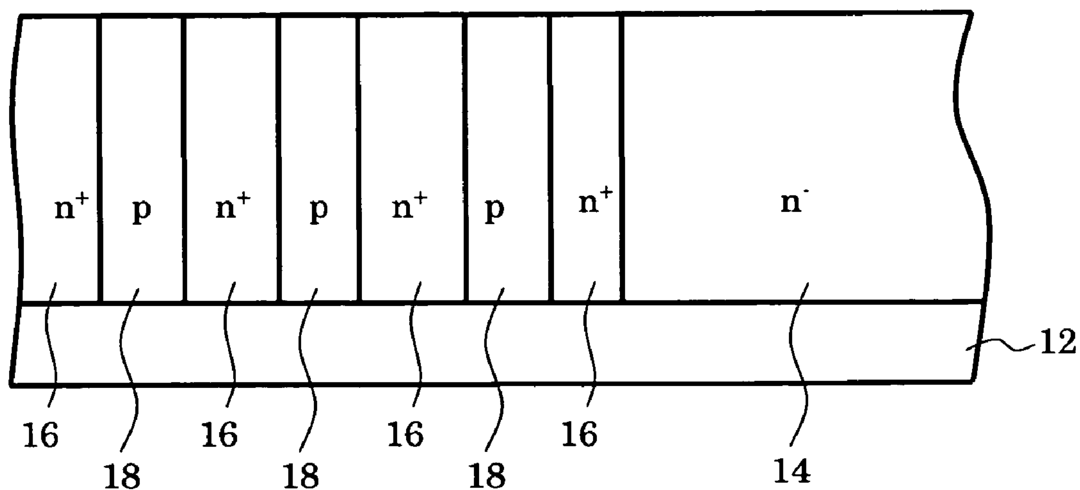
FIG. 21 is an enlarged cross-sectional view of the MISFET according to the first embodiment in a manufacturing step.

FIG. 19 is a cross-sectional view of the wafer after ion-implantation. A part of the pillar region is formed. Then the $n^-$-type layer of about 8 μm thickness is grown epitaxially again. FIG. 20 is a cross-sectional view of the wafer after second growth. Subsequently, second ion-implantation is carried out.

Figure 22:
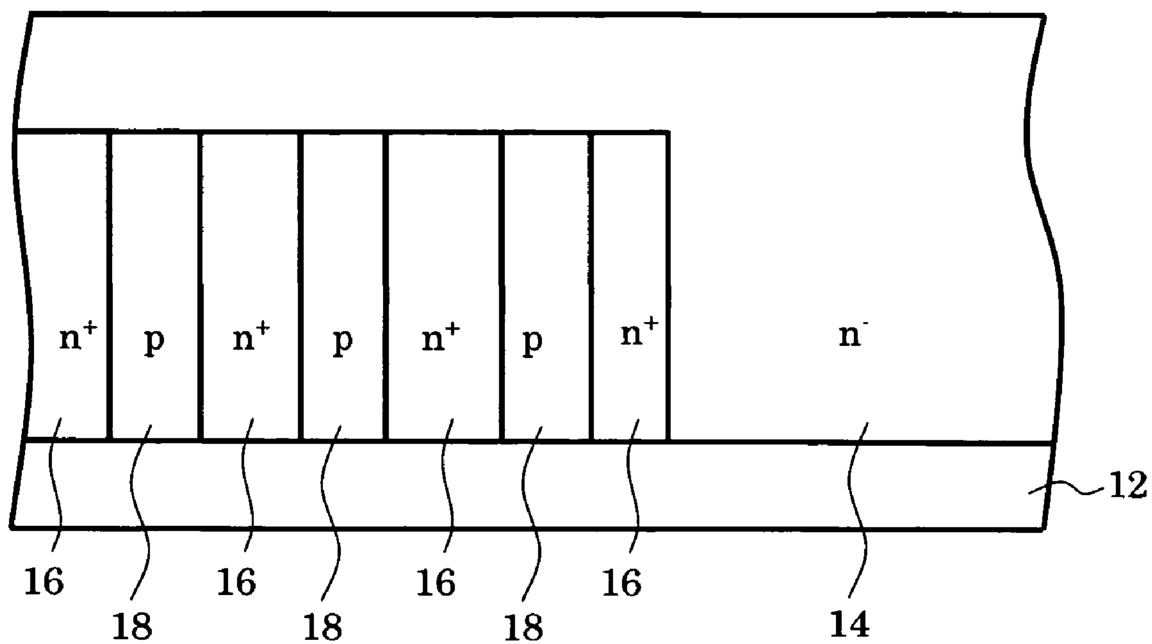
FIG. 22 is an enlarged cross-sectional view of the MISFET according to the first embodiment in a manufacturing step.

FIG. 22 is a cross-sectional view of the wafer after second ion-implantation. The n-type and p-type pillar regions are formed further.

Figure 23:
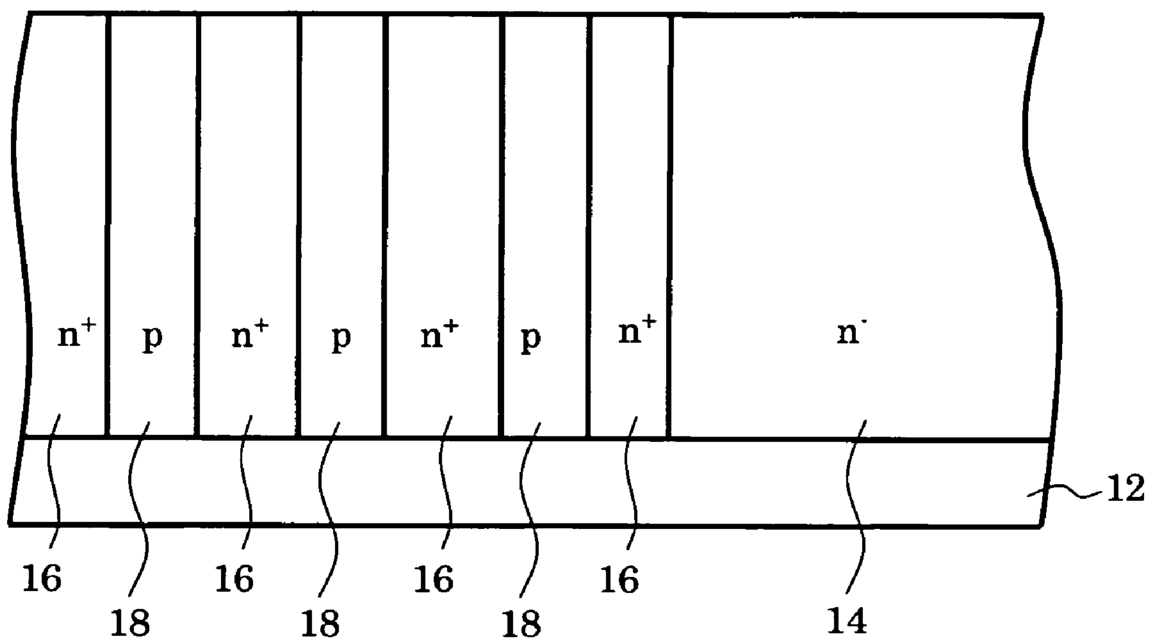
FIG. 23 is an enlarged cross-sectional view of the MISFET according to the first embodiment in a manufacturing step.

As shown in FIGS. 22 and 23, the $n^-$-type layer growth step and the ion-implantation step are carried out alternately six times, respectively. As a result, about 60 μm-thick pillar regions 16 and 18 and about 60 μm-thick $n^-$-type region 14 can be formed.

SECOND EMBODIMENT

A semiconductor device according to a second embodiment is explained below.

Figure 24:
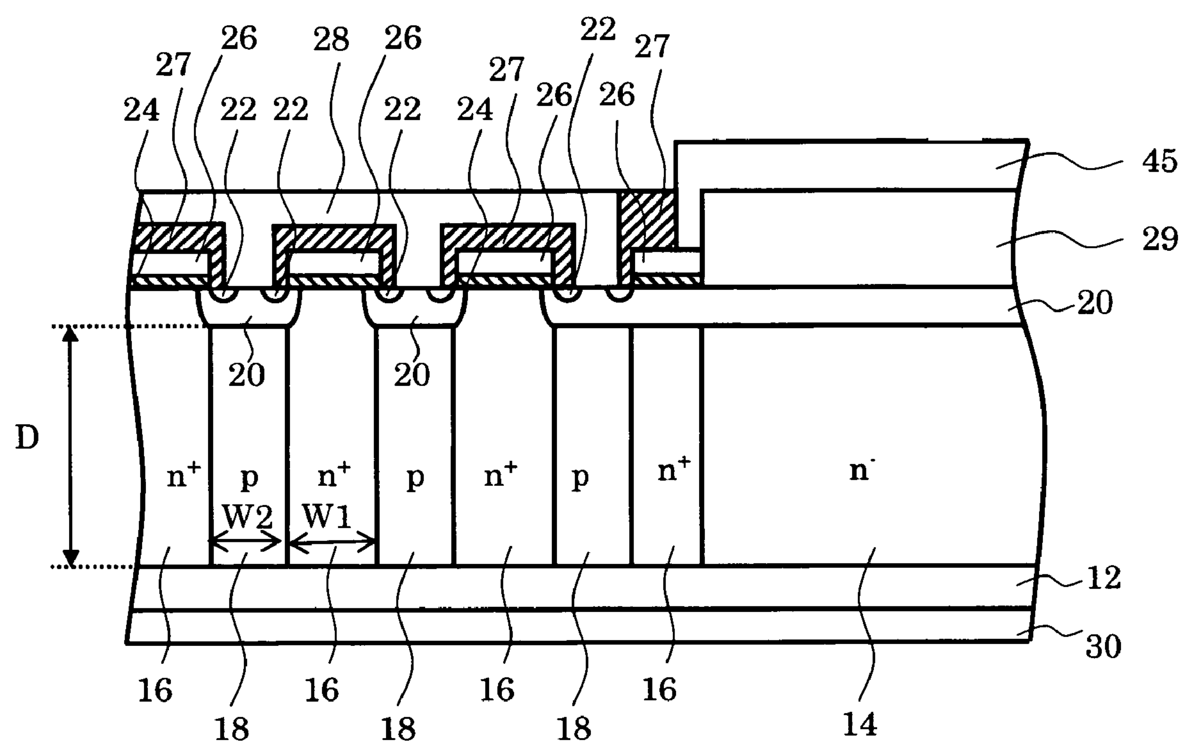
FIG. 24 is a cross-sectional view of the semiconductor device according to the second embodiment.

FIG. 24 is a cross-sectional view of a semiconductor device according to a second embodiment. Each element has the same number as that of FIGS. 1 through 23. In this embodiment, the n-type and the p-type pillar regions are not formed under the gate bonding pad 45, but the $n^-$-type region is provided instead. Also, the p-type base region 20 interposes between the $n^-$-type region 14 and the insulator 29 under the gate bonding pad. By this structure, the n-type region is depleted surely due to the p-n junction between the n-type region 14 and the p-type base region 20. As a result, the breakdown voltage of the n-type region is improved and hence the MISFET characteristic can be more stabilized. Also, a high speed switching is consistent with the improvement of an avalanche breakdown voltage. In addition, a various kinds of modifications shown in FIGS. 10 through 17 are applicable and the same effects can be obtained.

THIRD EMBODIMENT

Figure 25:
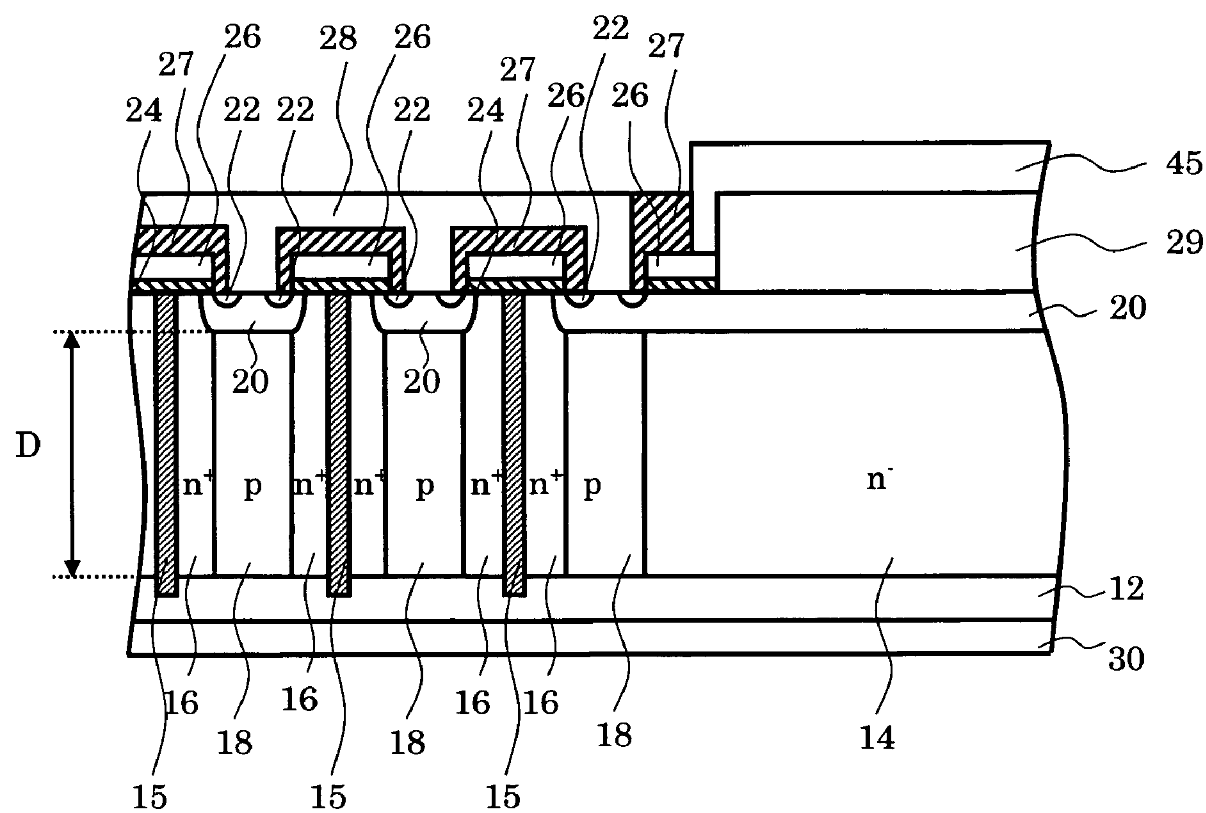
FIG. 25 is a partially cross-sectional view of the semiconductor device according to the third embodiment.
Figure 26:
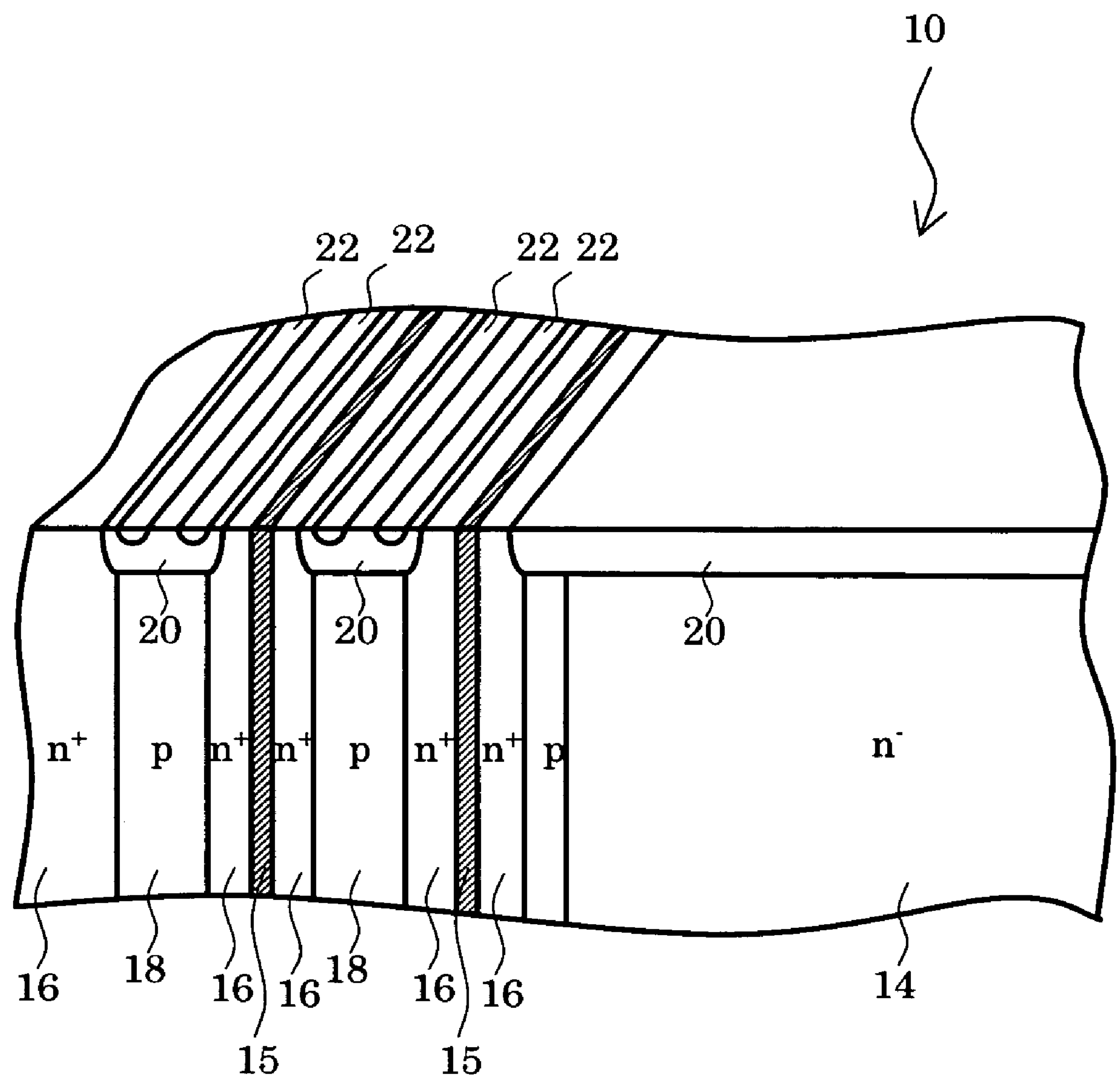
FIG. 26 is a partially cutaway view in perspective of the third embodiment.

FIG. 25 is a partially cross-sectional view of a semiconductor device according to a third embodiment. FIG. 26 is a partially cutaway view in perspective of the device of FIG. 25. Each element has the same number as that of FIGS. 1 through 24. In this embodiment, a vertical trench 15 filled with an insulator is provided in the central portion of the n-type pillar 16. Due to the trench the n-type pillar region 16 is easily depleted and hence a high speed switching is achieved.

In addition, if the trench is provided in the n-type region and both impurities are introduced through the sidewall of the trench, the p-type and the n-type pillar regions can be formed surely and easily, as described later. In this embodiment, the n-type and p-type pillar regions are not formed under the gate bonding pad 45, but the $n^-$-type region is provided instead. Also, the p-type base region 20 interposes between the $n^-$-type region 14 and the insulator 29 under the gate bonding pad. By this structure, the n-type region is depleted surely due to the p-n junction between the n-type region and the p-type base region. As a result, the breakdown voltage of the n-type region is improved and hence the MISFET characteristic can be more stabilized. Also, a high speed switching is consistent with the improvement of the avalanche breakdown.

Figure 27:
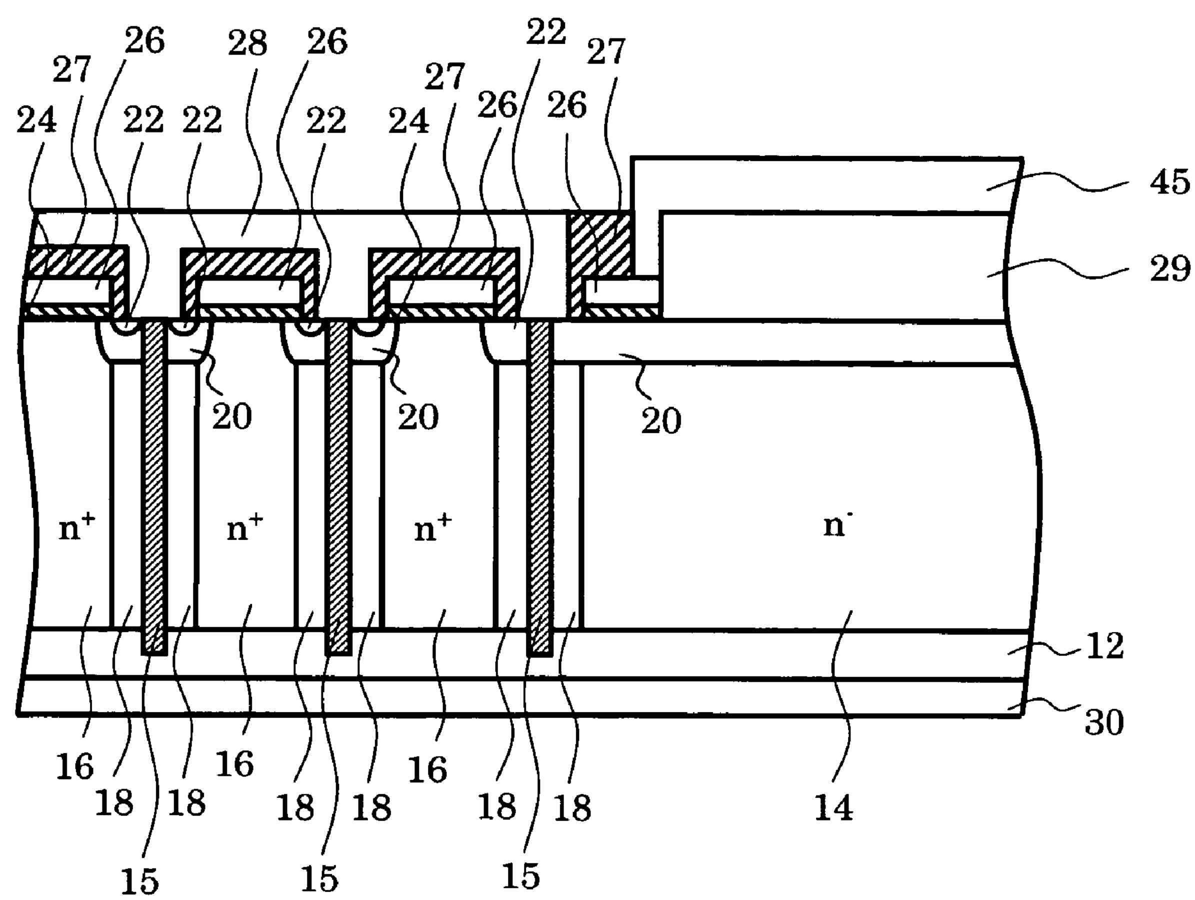
FIG. 27 is a partially cross-sectional view of the modified device according to the third embodiment.

FIG. 27 is a partially cross-sectional view of the modified device according to the embodiment. In this modified device, the trench filled with the insulator is provided in the central portion of the p-type pillar 18. By providing the $n^-$-type region under the gate bonding pad, the avalanche breakdown voltage of the MISFET is also improved.

FIGS. 28 through 34 are cross-sectional views of the device in each manufacturing step.

Figure 28:
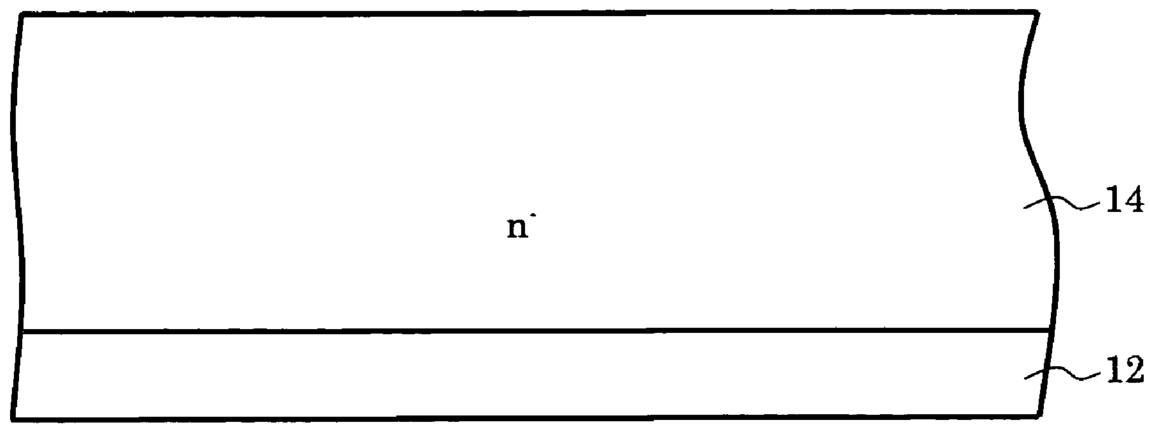
FIG. 28 is a cross-sectional view of the MISFET according to the third embodiment in the manufacturing step.
Figure 29:
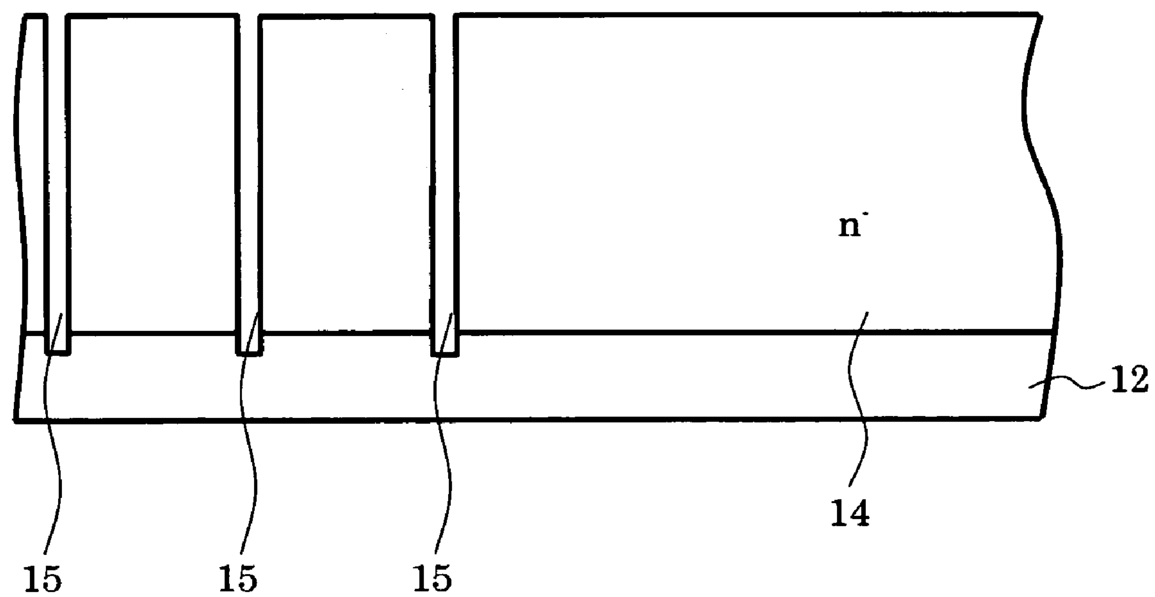
FIG. 29 is a cross-sectional view of the MISFET according to the third embodiment in the manufacturing step.

FIG. 28 is a cross-sectional view of a wafer after growing an epitaxial layer on an $n^+$-type silicon substrate 12. A trench 15 is formed so as to reach the $n^+$-type substrate 12 by using an etching mask (not shown), as shown in FIG. 29.

Figure 30:
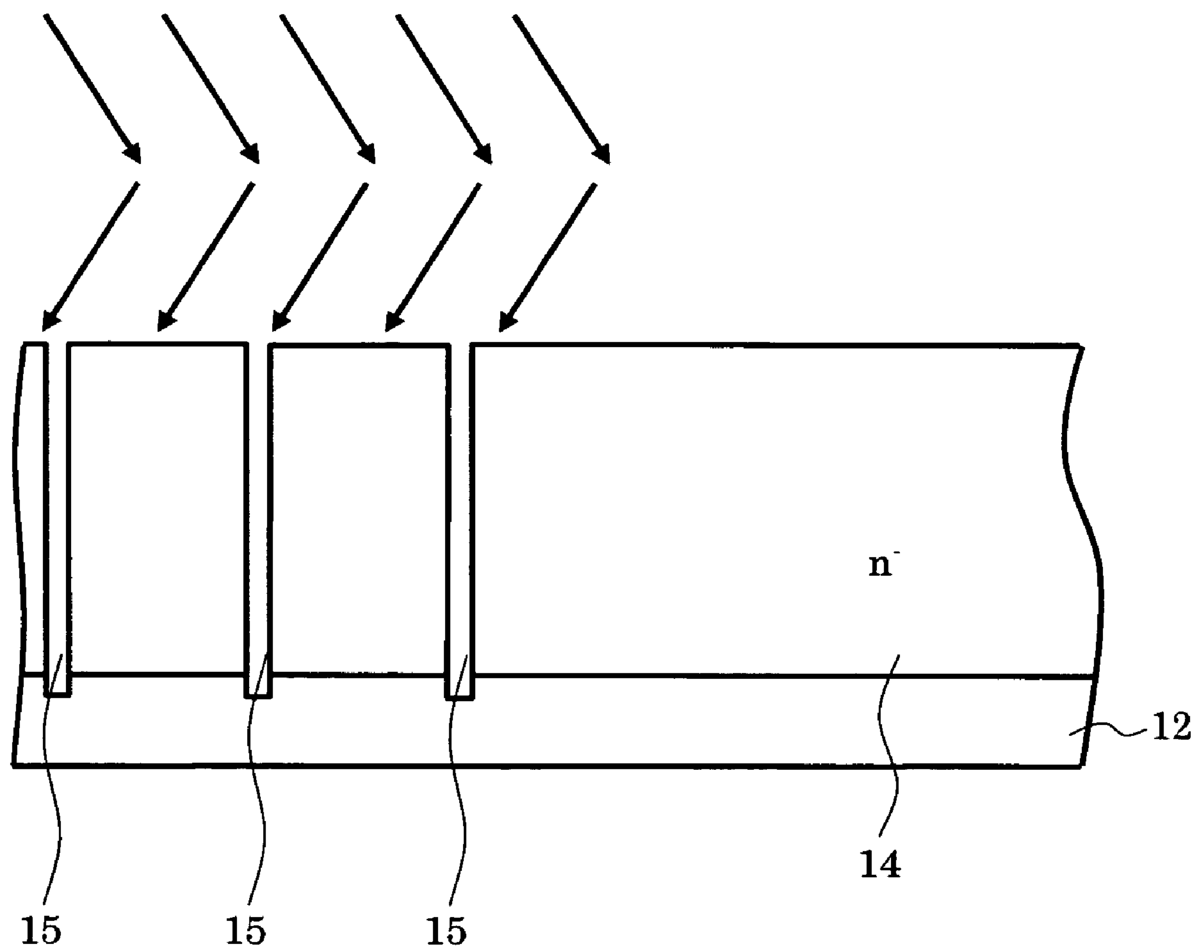
FIG. 30 is a cross-sectional view of the MISFET according to the third embodiment in the manufacturing step.

Subsequently, the n-type impurity and p-type impurity are implanted at a tilted angle through the sidewall of the trench, as shown in FIG. 30. Arsenic is used for the n-type impurity and boron is used for the p-type impurity, for example. And it is desirable to use the tilt and rotation ion-implantation method. Arsenic implantation can be carried out under an acceleration energy of 60 keV and a dose of $4.1\times10^{13}$ $cm^{-2}$. And boron implantation can be carried out under an acceleration energy of 60 keV and a dose of $4.1\times10^{13}$ $cm^{-2}$. A thermal diffusion method or plasma ion doping method are also used for the impurity introducing method.

Figure 31:
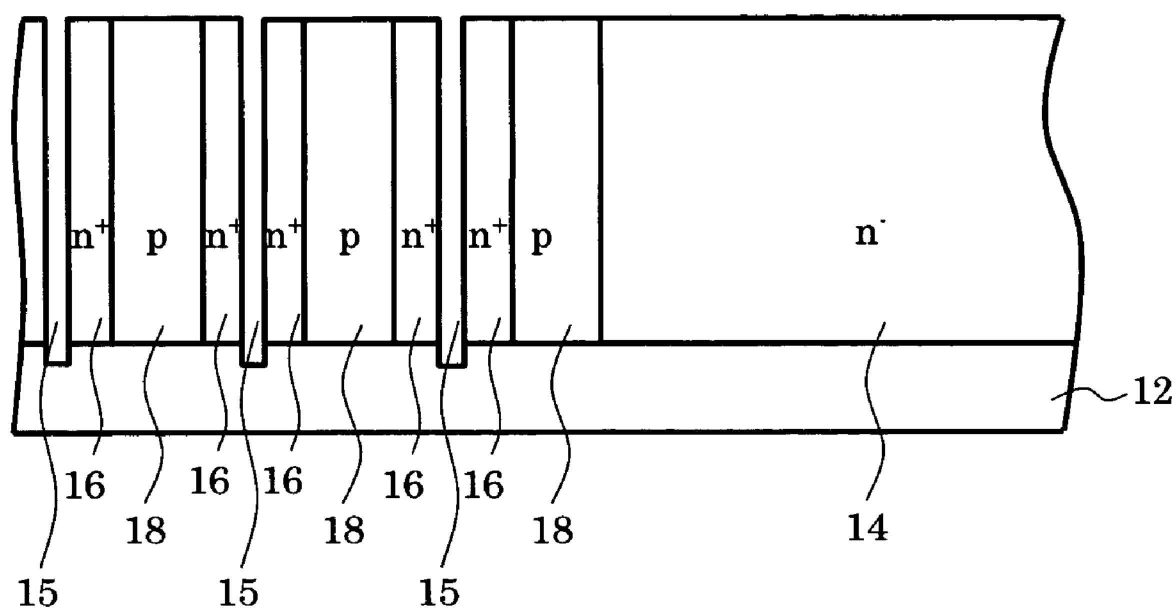
FIG. 31 is a cross-sectional view of the MISFET according to the third embodiment in the manufacturing step.

After ion-implantation, an annealing process is carried out. Then the n-type pillar region 16 and the p-type pillar region 18 are formed, respectively, as shown in FIG. 31. If the annealing is carried out at 1150 degrees centigrade for more than 30 hours, arsenic and boron can diffuse and be activated simultaneously. In this process, since the diffusion coefficient of boron is greater than that of the arsenic, the p-type pillar region is formed by deep boron diffusion and the n-type pillar region is formed by shallow arsenic diffusion in the vicinity of the trench where the arsenic concentration becomes greater than that of boron. The widths and concentrations of the pillar regions can be controlled accurately by selecting the impurity element, the ion-implantation condition and the annealing condition appropriately.

Figure 32:
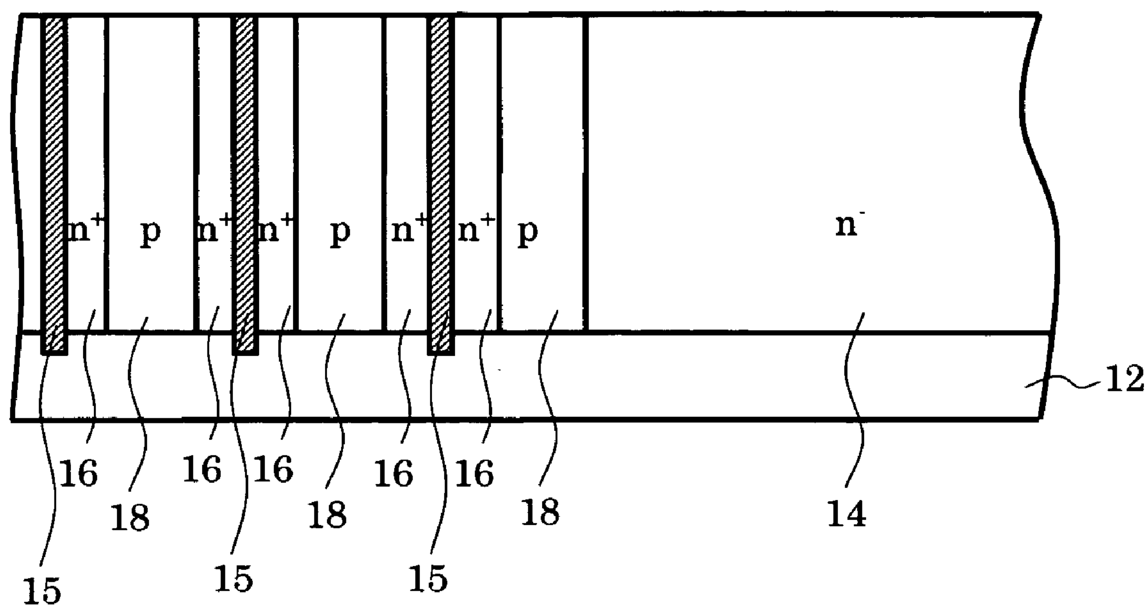
FIG. 32 is a cross-sectional view of the MISFET according to the third embodiment in the manufacturing step.

Subsequently, the trench is filled with the insulator, as shown in FIG. 32. Specifically, after the inner surface is oxidized thermally, the silicon oxide or silicon nitride is deposited by chemical vapor deposition method. And the surface is flattened by Chemical Mechanical Polishing (CMP) and/or etching method. Also, after the silicon oxide or silicon nitride film is deposited, the trench may be filled with a kind of filler. If the filler is composed of the particles, the thermal distortion caused by the material difference between the semiconductor around the trench and the filler can be eased.

Figure 33:
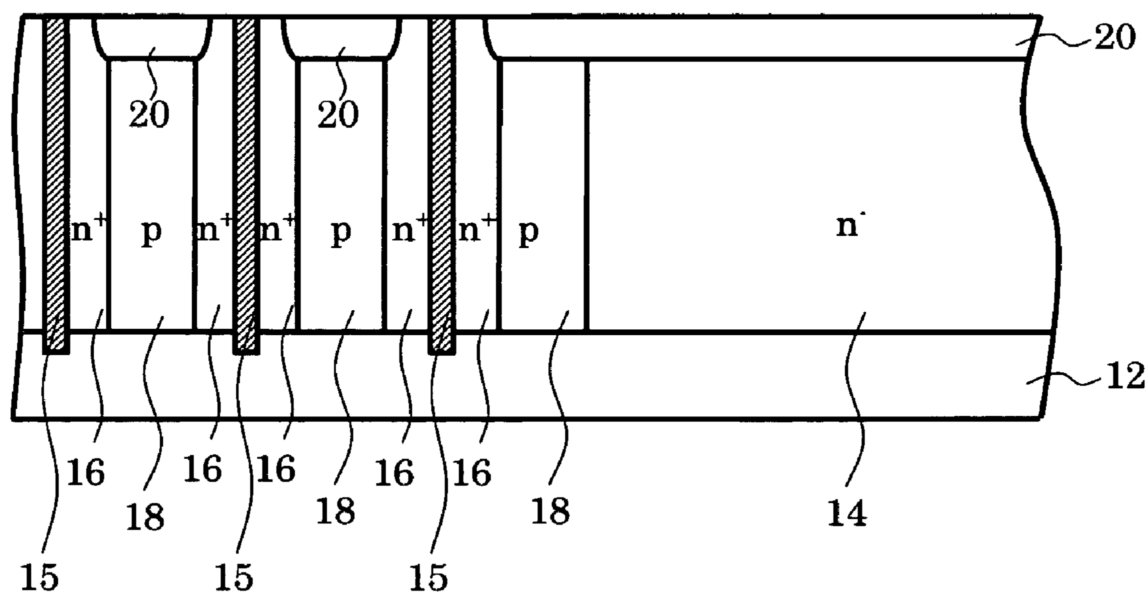
FIG. 33 is a cross-sectional view of the MISFET according to the third embodiment in the manufacturing step.
Figure 34:
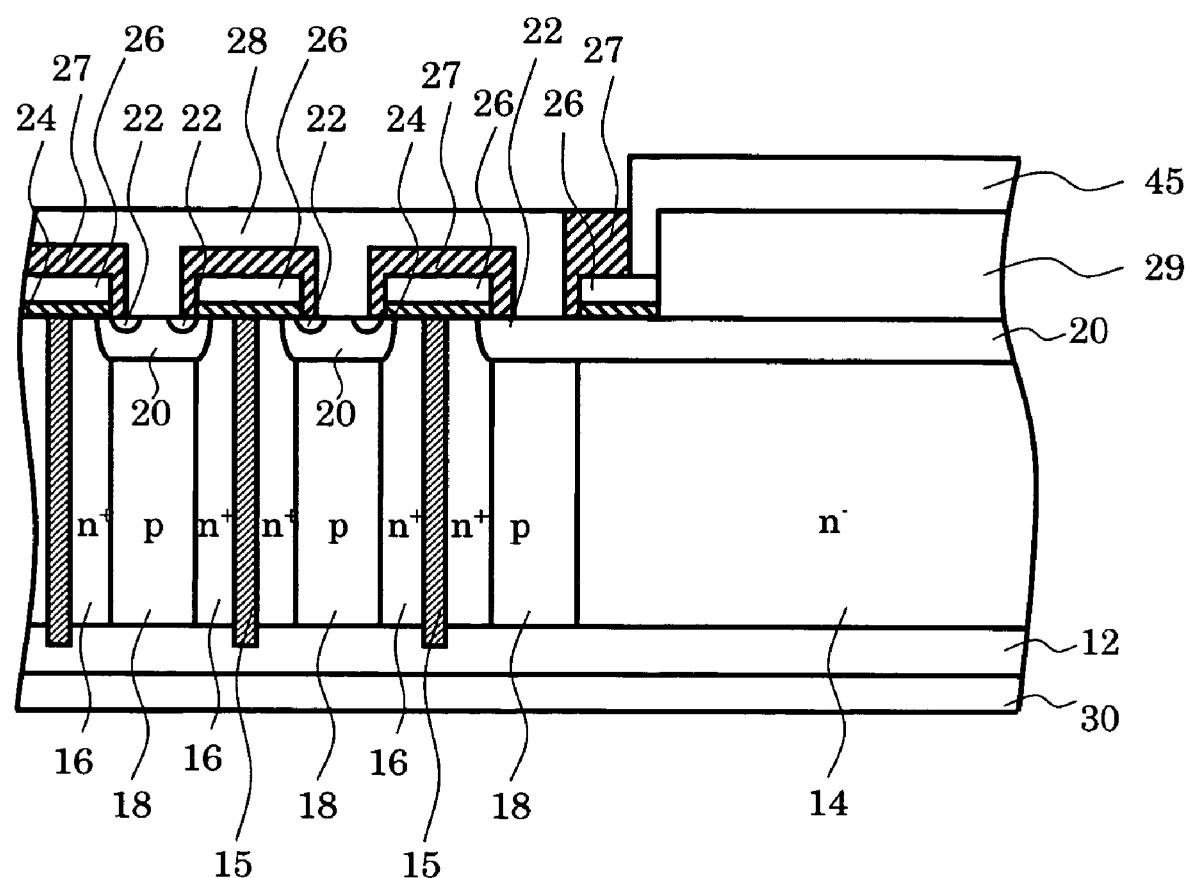
FIG. 34 is a cross-sectional view of the MISFET according to the third embodiment in the manufacturing step.
Figure 35:
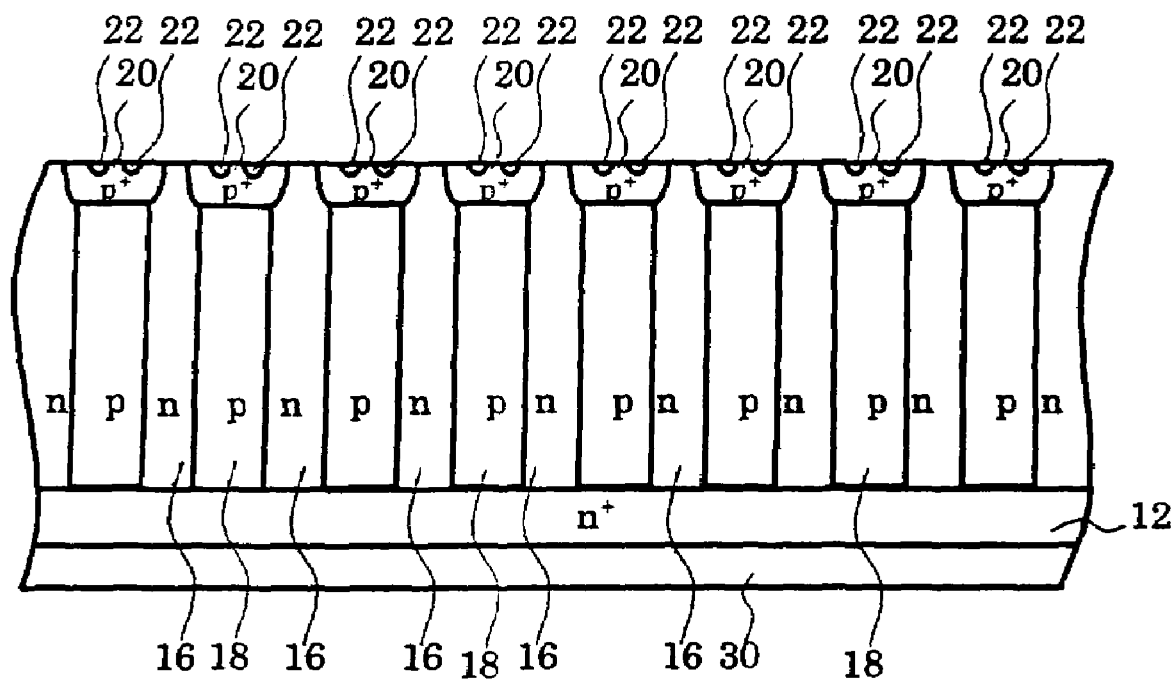
FIG. 35 is a cross-sectional view of active region of the power MISFET.
Figure 36:
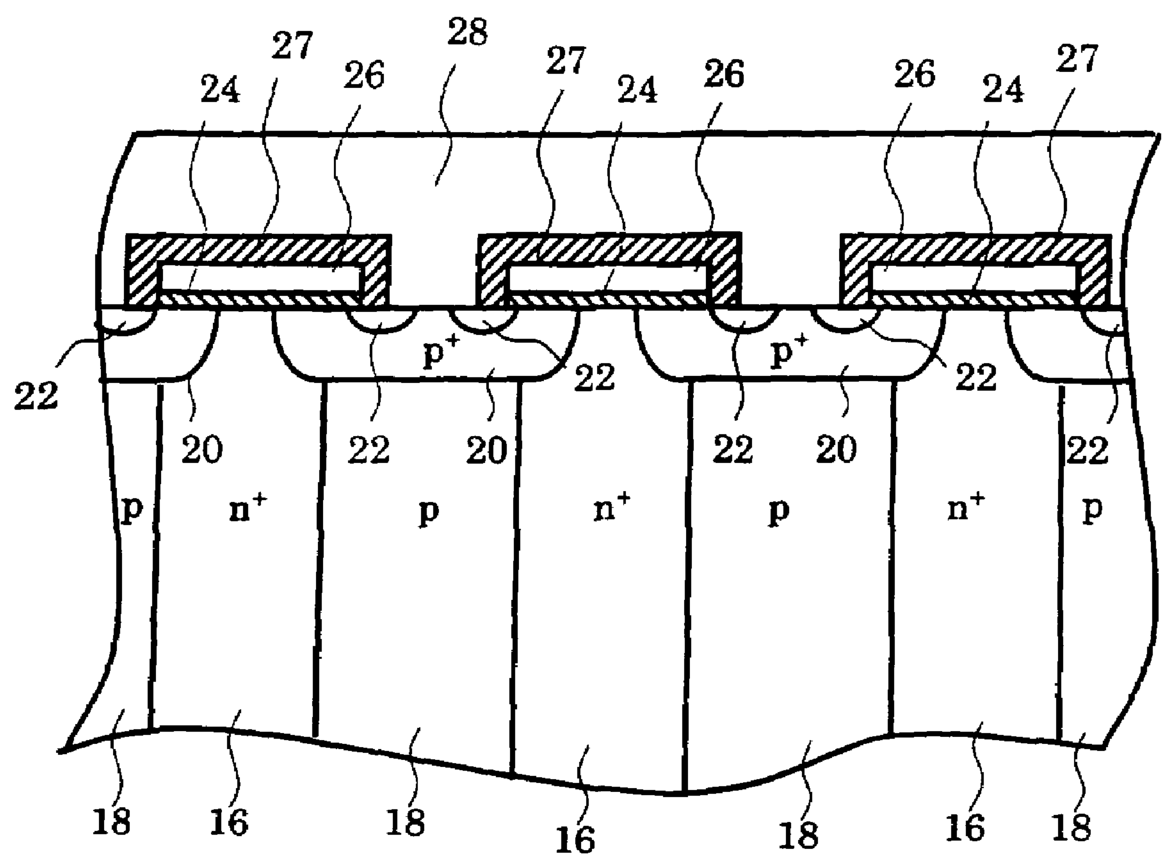
FIG. 36 is an enlarged cross-section of the electrode portion of FIG. 35.

The p-type base region 20 is formed on the p-type pillar region 18, as shown in FIG. 33. The $n^+$-type source region 22 is formed on the p-type base region 20 in a planer form, and the gate electrode 26 is provided on the channel region of the p-type pillar region 18 via the insulator 24. Further, the insulator 27 is formed and the source electrode 28 is formed, as shown in FIG. 34.

In this embodiment, as described above, the n-type and p-type pillar regions can be formed precisely since the n-type and p-type impurities are diffused through the sidewall of the trench provided in the $n^-$-type region. And since the $n^-$-type region remains without the trench under the gate bonding pad and the gate interconnection, the MISFET having the high avalanche breakdown voltage is achieved.

The manufacturing method shown in FIGS. 18 through 23 is complicated because the epitaxial growth and the ion-implantation steps are required a few times at least, respectively, in order to form the pillar regions and the $n^-$-type region. On the contrary, this embodiment has an advantage such that the manufacturing method can be simplified since the p-type and n-type pillar regions are formed simultaneously and by the self-align form.

In addition, each impurity element may be selected so that the diffusion coefficient of the n-type impurity is higher than that of the p-type impurity in a case of the modified MISFET shown in FIG. 27. In other words, since the n-type impurity of high diffusion coefficient and the p-type impurity of low diffusion coefficient are implanted through the side wall of the trench and the annealing is carried out, the n-type pillar region is formed in the region far from the trench and the p-type pillar region is formed in the vicinity of the trench, as shown in FIG. 27.

Additional advantages and modifications will readily occur to those skilled in the art. More specifically various kinds of elements such as materials, conductivity types, carrier concentrations, layout and thickness can be used. Also, the process condition and method can be modified in the method for manufacturing.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:

a first semiconductor layer including:

a semiconductor pillar region having a first semiconductor pillar region of a first conductivity type and a second semiconductor pillar region of a second conductivity type, the first semiconductor pillar region and the second semiconductor pillar region being formed alternately according to a predetermined successive pattern;

a semiconductor base region of a second conductivity type, each of the first and second semiconductor pillar regions being electrically connected with the semiconductor base region;

a first major electrode region of a first conductivity type selectively provided on the semiconductor base region; and a second major electrode region connected with at least the first semiconductor pillar region;

a control electrode configured to control a current between the first major electrode region and the second major electrode region; and an electrode pad provided on a pad formation part of the first semiconductor layer via an insulator and connected with the control electrode, the pad formation part including a successive pattern nonformation part where the predetermined successive pattern of the semiconductor pillar region is not formed.

2. The semiconductor device according to claim 1, wherein the successive pattern nonformation part is provided substantially all over the pad formation part.

3. The semiconductor device according to claim 1, further comprising a wiring layer provided on the first semiconductor layer via an insulating layer, the wiring layer connecting the control electrode and the electrode pad.

4. The semiconductor device according to claim 1, wherein the successive pattern nonformation part is provided substantially all over a part on which a wiring layer is provided.

5. The semiconductor device according to claim 1, further comprising a first major electrode commonly connected with the first major electrode region and the semiconductor base region.

6. The semiconductor device according to claim 1, wherein the first semiconductor layer further includes a semiconductor region of the first conductivity type, the semiconductor region is connected with the second major electrode region, and a content of an impurity of the semiconductor region is lower than a content of an impurity of the first semiconductor pillar region.

7. The semiconductor device according to claim 5, further comprising a second semiconductor layer of a second conductivity type, the second semiconductor layer is connected with the first major electrode.

8. The semiconductor device according to claim 7, wherein the second semiconductor layer is electrically connected with the semiconductor base region.

9. The semiconductor device according to claim 1, wherein a content of an impurity of the second semiconductor pillar region is higher than a content of an impurity of the first semiconductor pillar region.

10. The semiconductor device according to claim 1, further comprising a trench provided in a position adjacent to the first semiconductor pillar region or the second semiconductor pillar region, the trench being filled with a filler.

11. The semiconductor device according to claim 10, wherein the first semiconductor pillar region and the second semiconductor pillar region are formed by diffusion of impurities through a side wall of the trench.

12. The semiconductor device according to claim 1, wherein the predetermined successive pattern is a pattern in which the first semiconductor pillar region and the second semiconductor pillar region is arranged in an alternating sequence.

13. The semiconductor device according to claim 1, wherein the control electrode is provided via an insulating layer in a position adjacent to the semiconductor base region between the first major electrode region and the first semiconductor pillar region.

14. A semiconductor device comprising:

a first semiconductor layer including:

a semiconductor pillar region having a first semiconductor pillar region of a first conductivity type and a second semiconductor pillar region of a second conductivity type, the first semiconductor pillar region and the second semiconductor pillar region being formed alternately according to a predetermined successive pattern;

a semiconductor base region of a second conductivity type, each of the first and second semiconductor pillar regions being electrically connected with the semiconductor base region;

a first major electrode region of a first conductivity type selectively provided on the semiconductor base region; and a second major electrode region connected with at least the first semiconductor pillar region;

a control electrode configured to control a current between the first major electrode region and the second major electrode region;

a wiring layer provided on a wiring formation part of the first semiconductor layer via an insulator and connected with the control electrode; and an electrode pad connected with the wiring layer, the wiring formation part including a successive pattern nonformation part where the predetermined successive pattern of the semiconductor pillar region is not formed.

15. The semiconductor device according to claim 14, wherein the successive pattern nonformation part is provided substantially all over the wiring formation part.

16. The semiconductor device according to claim 14, further comprising a trench provided in a position adjacent to the first semiconductor pillar region or the second semiconductor pillar region, the trench being filled with a filler, wherein the first semiconductor pillar region and the second semiconductor pillar region are formed by diffusion of impurities through a side wall of the trench.

* * * * *